US012787169B2

(12) United States Patent
Kuwabara et al.

(10) Patent No.: US 12,787,169 B2

(45) Date of Patent: Nov. 3, 2026

(54) WIRING SUBSTRATE

(71) Applicant: IBIDEN CO., LTD., Gifu (JP)

(72) Inventors: Masashi Kuwabara, Ibi-gun (JP); Jun Sakai, Ogaki (JP); Shiho Fukushima, Ibi-gun (JP)

(73) Assignee: IBIDEN CO., LTD., Ogaki (JP)

( * ) Notice: Subject to any disclaimer, the term of this patent is extended or adjusted under 35 U.S.C. 154(b) by 243 days.

(21) Appl. No.: 18/613,202

(22) Filed: Mar. 22, 2024

(65) Prior Publication Data

US 2024/0324103 A1 Sep. 26, 2024

(30) Foreign Application Priority Data

Mar. 24, 2023 (JP) ................................. 2023-048710

(51) Int. Cl.

| | |
|---|---|
| ***H05K 1/11*** | (2006.01) |
| ***H05K 1/03*** | (2006.01) |
| ***H05K 3/16*** | (2006.01) |

(52) U.S. Cl.

CPC ........... *H05K 1/115* (2013.01); *H05K 1/0306* (2013.01); *H05K 3/16* (2013.01); *H05K 2201/0209* (2013.01); *H05K 2201/0242* (2013.01); *H05K 2201/0266* (2013.01); *H05K 2201/032* (2013.01); *H05K 2201/09536* (2013.01)

(58) Field of Classification Search

CPC .... H05K 1/115; H05K 1/0306; H05K 1/0271; H05K 1/0296; H05K 1/0353; H05K 2201/0209; H05K 2201/0245; H05K 2201/0323; H05K 2201/09536

See application file for complete search history.

(56) References Cited

U.S. PATENT DOCUMENTS

| | | | | |
|---|---|---|---|---|
| 2012/0043127 A1* | 2/2012 | Lin | ...................... | H05K 1/0203 174/266 |
| 2015/0357276 A1* | 12/2015 | Shimizu | ................ | H10W 70/65 361/783 |
| 2016/0150642 A1* | 5/2016 | Kajita | .................... | H05K 1/115 174/262 |
| 2018/0166372 A1* | 6/2018 | Shimizu | .............. | H10W 70/685 |
| 2022/0071016 A1 | 3/2022 | Hwang et al. | | |

FOREIGN PATENT DOCUMENTS

| | | |
|---|---|---|
| JP | 2015-133473 A | 7/2015 |

* cited by examiner

*Primary Examiner* — Roshn K Varghese

(74) *Attorney, Agent, or Firm* — Finnegan, Henderson, Farabow, Garrett & Dunner, LLP

(57) ABSTRACT

A wiring substrate includes a core substrate including a through-hole conductor, a first resin insulating layer, a first conductor layer including a seed layer and an electrolytic plating layer, a via conductor formed such that the via conductor electrically connects the through-hole conductor and first conductor layer, and a second resin insulating layer covering the first conductor layer. The core substrate includes a glass substrate such that the through-hole conductor is penetrating through the glass substrate, the seed layer includes a first layer formed on the first resin insulating layer and a second layer formed on the first layer, and the first conductor layer includes a conductor circuit such that a width of the first layer is larger than a width of the second layer in the conductor circuit and a width of the electrolytic plating layer is larger than the width of the first layer in the conductor circuit.

20 Claims, 9 Drawing Sheets

WIRING SUBSTRATE

CROSS-REFERENCE TO RELATED APPLICATIONS

The present application is based upon and claims the benefit of priority to Japanese Patent Application No. 2023-048710, filed Mar. 24, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2015-133473 describes a multilayer substrate having a core formed of a glass material. The entire contents of this publication are incorporated herein by reference.

SUMMARY OF THE INVENTION

According to one aspect of the present invention, a wiring substrate includes a core substrate including a through-hole conductor, a first resin insulating layer formed on the core substrate, a first conductor layer formed on the first resin insulating layer and including a seed layer and an electrolytic plating layer formed on the seed layer, a via conductor formed in the first resin insulating layer such that the via conductor electrically connects the through-hole conductor and the first conductor layer, and a second resin insulating layer formed on the first resin insulating layer such that the second resin insulating layer is covering the first conductor layer. The core substrate includes a glass substrate such that the through-hole conductor is penetrating through the glass substrate, the first conductor layer is formed such that the seed layer includes a first layer formed on a surface of the first resin insulating layer and a second layer formed on the first layer, and the first conductor layer includes a conductor circuit such that a width of the first layer is larger than a width of the second layer in the conductor circuit and that a width of the electrolytic plating layer is larger than the width of the first layer in the conductor circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
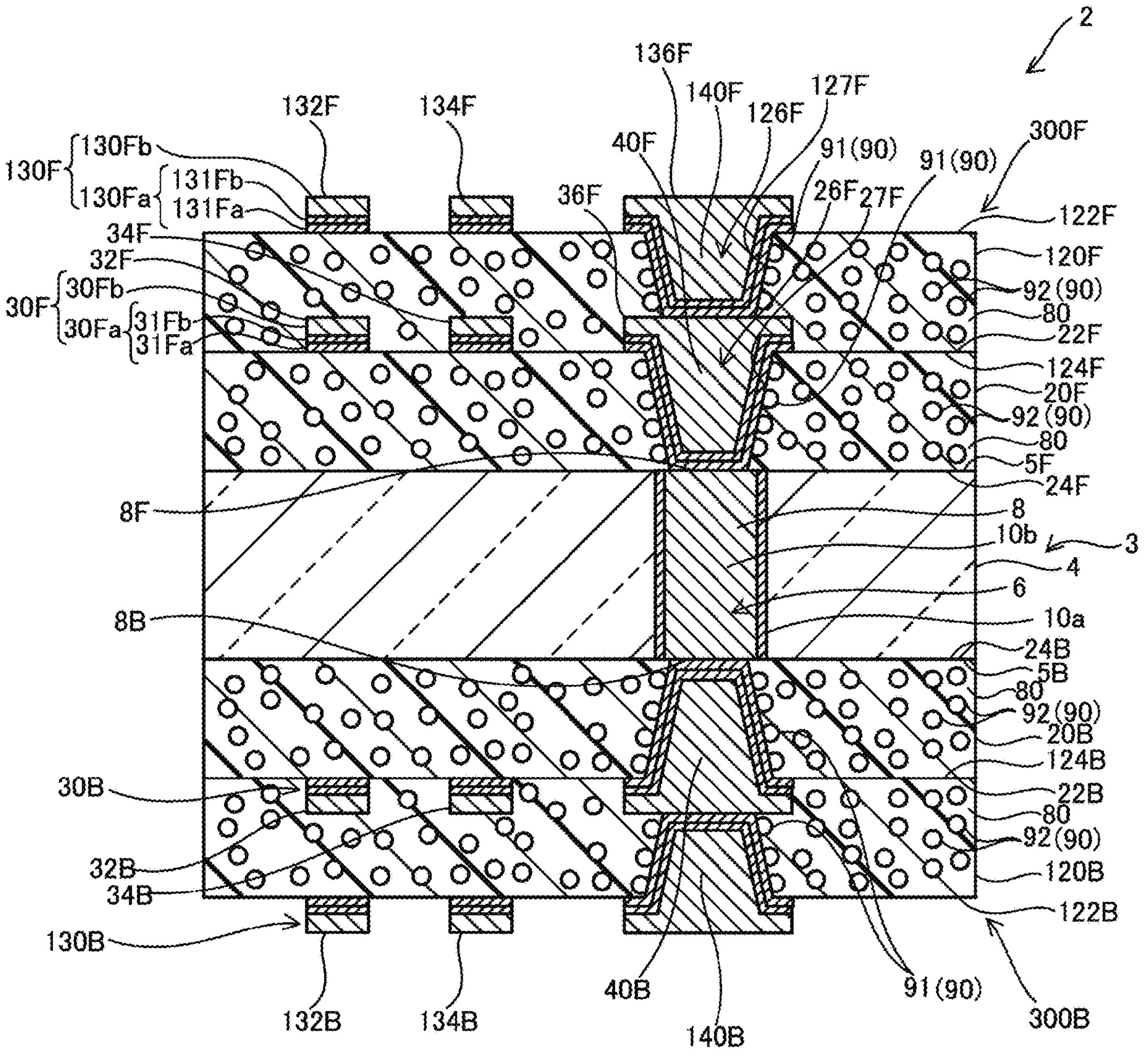
FIG. 1 is a cross-sectional view schematically illustrating a wiring substrate according to an embodiment of the present invention.

Embodiments will now be described with reference to the accompanying drawings, wherein like reference numerals designate corresponding or identical elements throughout the various drawings.

EMBODIMENT

Figure 2:
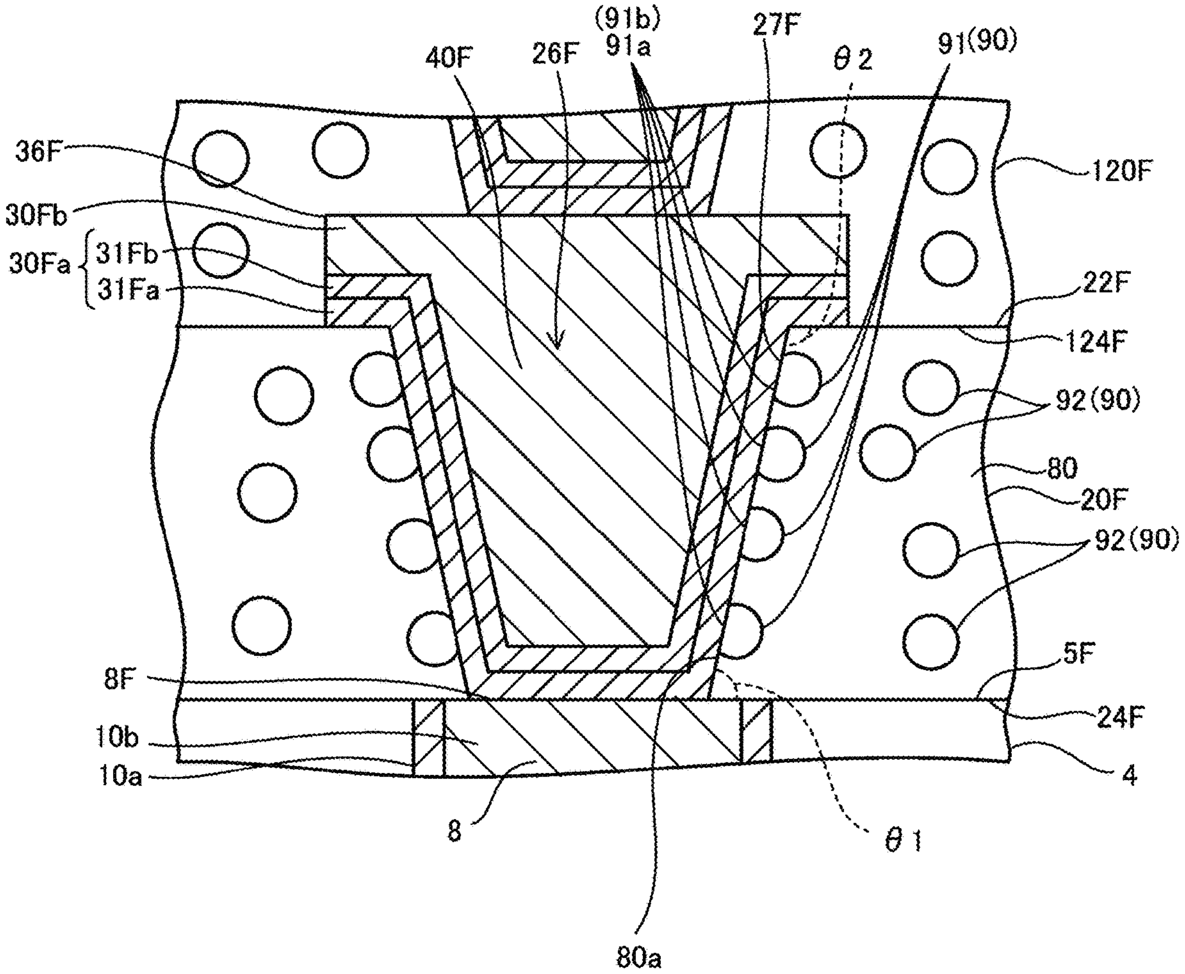
FIG. 2 is an enlarged cross-sectional view schematically illustrating a part of a wiring substrate according to an embodiment of the present invention.
Figure 3:
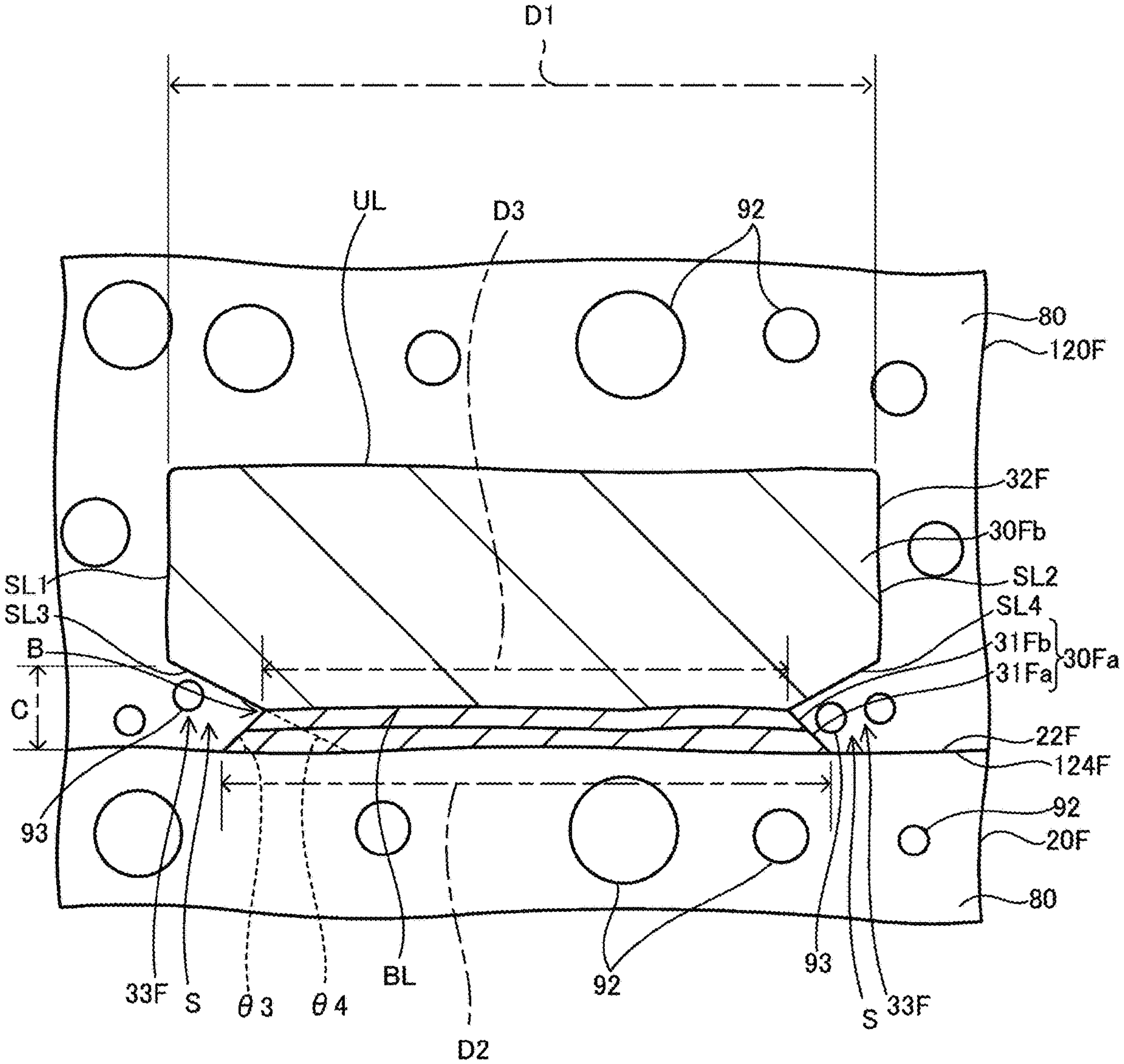
FIG. 3 is an enlarged cross-sectional view schematically illustrating a part of a wiring substrate according to an embodiment of the present invention.

FIG. 1 is a cross-sectional view illustrating a wiring substrate 2 of an embodiment. FIGS. 2 and 3 are each an enlarged cross-sectional view illustrating a part of the wiring substrate 2 of the embodiment. As illustrated in FIG. 1, the wiring substrate 2 includes a core substrate 3, a front side build-up layer (300F), and a back side build-up layer (300B).

The core substrate 3 includes a substrate 4, through holes 6, and through-hole conductors 8. The substrate 4 has a front surface (5F) and a back surface (5B) on the opposite side with respect to the front surface (5F). The substrate 4 is formed of glass. The through holes 6 penetrate the substrate 4. The through holes 6 each have a substantially cylindrical shape. The through holes 6 each have a substantially constant diameter. It is also possible that the through holes 6 each have a substantially truncated cone shape. It is also possible that the through holes 6 each have a shape obtained by connecting two substantially conical shapes. The two cones are a front surface side cone and a back surface side cone. A bottom surface of the front surface side cone is positioned on the front surface (5F), and a bottom surface of the back surface side cone is positioned on the back surface (5B). In this case, a side surface of each of the through holes 6 is formed of a surface tapering from the front surface (5F) toward the back surface (5B) and a surface tapering from the back surface (5B) toward the front surface (5F).

The through-hole conductors 8 are respectively formed in the through holes 6. The through-hole conductors 8 are mainly formed of copper. The through-hole conductors 8 include a seed layer (10*a*) formed on inner wall surfaces of the through holes 6 and an electrolytic plating layer (10*b*) formed on the seed layer (10*a*). The electrolytic plating layer (10*b*) fills the through holes 6. The seed layer (10*a*) is formed by electroless plating. The through-hole conductors 8 each have an upper end (8F) and a lower end (8B). A surface of the upper end (8F) and the front surface (5F) form substantially the same flat surface. A surface of the lower end (8B) and the back surface (5B) form substantially the same flat surface. The upper end (8F) is exposed from the front surface (5F). The lower end (8B) is exposed from the back surface (5B).

The front side build-up layer (300F) is formed on the front surface (5F) of the substrate 4. The front side build-up layer (300F) includes front side resin insulating layers, front side conductor layers, and front side via conductors that penetrate the front side resin insulating layers. The front side conductor layers and the front side via conductors are electrically connected to the through-hole conductors 8. The front side resin insulating layers and the front side conductor layers are alternately laminated. The front side resin insulating layers in FIG. 1 are a first resin insulating layer (20F) and a second resin insulating layer (120F). The front side conductor layers are a first conductor layer (30F) and a second conductor layer (130F). The front side via conductors are first via conductors (40F) and second via conductors (140F).

The first resin insulating layer (20F) has a first surface (22F) and a second surface (24F) on the opposite side with respect to the first surface (22F). The first resin insulating layer (20F) is formed on the front surface (5F) of the substrate 4 with the second surface (24F) facing the front surface (5F). In the example of FIG. 1, the second surface (24F) is in contact with the front surface (5F). The second surface (24F) is in contact with a part of the upper end (8F). No conductor circuit exists between the front surface (5F) and the second surface (24F). No conductor circuit is formed on the front surface (5F). The first resin insulating layer (20F) has first openings (26F) that respectively reach the upper ends (8F) of the through-hole conductors 8. The first openings (26F) each have an opening (top opening) on the first surface (22F) and an opening (bottom opening) on the second surface (24F). The top opening and the bottom opening each have a substantially circular shape. The bottom opening can expose the upper end (8F) and the front surface (5F) at the same time. In this case, the front surface (5F) around the upper end (8F) is exposed. It is also possible that the bottom opening exposes a part of the upper end (8F) and the front surface (5F) around the part (first example). It is also possible that the bottom opening exposes the entire upper end (8F) and the front surface (5F) around the upper end (8F) (second example). As illustrated in FIG. 1, the bottom opening can expose only the upper end (8F) (third example). Two examples among the first example, the second example and the third example may be mixed. All of the first example, the second example and the third example may be mixed. It is preferable that the first example and the third example are mixed. In this case, the upper ends (8F) of some of the through-hole conductors 8 are exposed by the openings of the first example, and the upper ends (8F) of the remaining through-hole conductors are exposed by the openings of the third example. The first resin insulating layer (20F) is formed of a resin 80 and a large number of inorganic particles 90 dispersed in the resin 80. The resin 80 is an epoxy resin. Examples of the resin include a thermosetting resin and a photocurable resin. The inorganic particles 90 are glass particles. It is also possible that the inorganic particles 90 are alumina particles. A content of the inorganic particles 90 in the first resin insulating layer (20F) is 75 wt % or more.

As illustrated in FIGS. 1 and 2, the inorganic particles 90 include first inorganic particles 91 forming an inner wall surface (27F) of each of the first openings (26F) and second inorganic particles 92 embedded in the resin 80. The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

The first surface (22F) of the first resin insulating layer (20F) is formed only of the resin 80. No inorganic particles 90 (second inorganic particles 92) are exposed from the first surface (22F). The first surface (22F) does not include surfaces of the second inorganic particles 92. No unevenness is formed on the first surface (22F) of the first resin insulating layer (20F). The first surface (22F) is not roughened. The first surface (22F) is formed smooth.

As illustrated in FIG. 2, the inner wall surface (27F) of each of the first openings (26F) is formed of the resin 80 and the first inorganic particles 91. The first inorganic particles 91 each have a flat part (91*a*). The flat parts (91*a*) form the inner wall surface (27F). The inner wall surface (27F) is formed of the resin 80 and the flat parts (91*a*). The flat parts (91*a*) and a surface of the resin 80 that forms the inner wall surface (27F) form substantially a common surface. No unevenness is formed on the resin 80 that forms the inner wall surface (27F). The surface of the resin 80 that forms the inner wall surface (27F) is smooth. No unevenness is formed on exposed surfaces (91*b*) of the flat parts (91*a*) (surfaces that form the inner wall surface (27F)). The exposed surfaces (91*b*) of the flat parts (91*a*) are smooth. The inner wall surface (27F) is formed smooth. The inner wall surface (27F) has an arithmetic mean roughness (Ra) of 1.0 μm or less.

The flat parts (91*a*) of the first inorganic particles 91 substantially coincide with a surface obtained by extending the surface (80*a*) of the resin 80 formed around the first inorganic particles 91 (a surface that forms the inner wall surface (27F)). The flat parts (91*a*) drawn with substantially straight lines in FIGS. 1 and 2 each mean a flat surface. In the cross sections illustrated in FIGS. 1 and 2, the flat parts (91*a*) are each a flat surface. It is also possible that the flat parts (91*a*) are not each a perfect flat surface. The flat parts (91*a*) are each substantially a flat surface and are each substantially a smooth surface.

As illustrated in FIG. 2, the inner wall surface (27F) of each of the first openings (26F) is inclined. An angle (inclination angle) (θ1) between the front surface (5F) of the substrate 4 and the inner wall surface (27F) is 70 degrees or more and 85 degrees or less. An angle (inclination angle) (θ2) between the first surface (22F) of the first resin insulating layer (20F) and the inner wall surface (27F) is 95 degrees or more and 110 degrees or less.

In the cross-sections illustrated in FIGS. 1 and 2, the first openings (26F) are illustrated to each have a substantially inverted trapezoidal shape. However, the actual first openings (26F) each have a substantially inverted truncated cone shape. Therefore, the actual inner wall surface (side wall) (27F) of each of the first openings (26F) is a substantially curved surface. That is, the common surface formed by the flat parts (91*a*) and the resin 80 includes the inner wall surface (side wall) (27F) formed as a substantially curved surface.

As illustrated in FIG. 1, the first conductor layer (30F) is formed on the first surface (22F) of the first resin insulating layer (20F). The first conductor layer (30F) includes a first signal wiring (32F), a second signal wiring (34F), and lands (36F). Although not illustrated in the drawings, the first conductor layer (30F) also includes conductor circuits other than the first signal wiring (32F), the second signal wiring (34F), and the lands (36F). The first signal wiring (32F) and the second signal wiring (34F) form a pair wiring. The first conductor layer (30F) is mainly formed of copper. The first conductor layer (30F) is formed of a seed layer (30Fa) and an electrolytic plating layer (30Fb) on the seed layer (30Fa). For example, the seed layer (30Fa) is formed of a copper alloy. The seed layer (30Fa) is formed by sputtering. The seed layer (30Fa) is formed of a first layer (31Fa) on the first surface (22F) and a second layer (31Fb) on the first layer (31Fa). The first layer (31Fa) is in contact with the first surface (22F). The second layer (31Fb) is not essential. A surface of the first conductor layer (30F) facing the first surface (22F) of the first resin insulating layer (20F) is formed along a surface shape of the first surface (22F). The first conductor layer (30F) does not extend to an inner side of the first surface (22F) of the first resin insulating layer (20F).

The first layer (31Fa) is formed of a copper alloy containing copper, aluminum, and a specific metal. Examples of the specific metal include nickel, zinc, gallium, silicon, and magnesium. The copper alloy preferably contains one specific metal, or two specific metals, or three specific metals. A content of copper in the copper alloy is 90.0 at % or more. A content of aluminum in the copper alloy is 1.0 at % or more and 15.0 at % or less. An example of the specific metal is silicon. A content of the specific metal in the copper alloy is 0.5 at % or more and 10.0 at % or less. The first layer (31Fa) may contain impurities. Examples of the impurities include oxygen and carbon. The first layer (31Fa) can contain oxygen or carbon. The first layer (31Fa) can contain oxygen and carbon. In the embodiment, the copper alloy further contains carbon. A content of carbon in the copper alloy is 50 ppm or less. The copper alloy further contains oxygen. A content of oxygen in the copper alloy is 100 ppm or less. The values of the contents of the elements described above are examples. Among the elements forming the first layer (31Fa), copper has the largest content. The content of aluminum is the next largest. The content of the specific metal is less than the content of aluminum. Therefore, copper is a primary metal, aluminum is a first secondary metal, and the specific metal is a second secondary metal. A content of the impurities is smaller than the content of the specific metal.

The second layer (31Fb) is formed of copper. A content of copper forming the second layer (31Fb) is 99.9 at % or more. The content of copper in the second layer (31Fb) is preferably 99.95 at % or more. The electrolytic plating layer (30Fb) is formed of copper. A content of copper forming the electrolytic plating layer (30Fb) is 99.9 at % or more. The content of copper in the electrolytic plating layer (30Fb) is preferably 99.95 at % or more.

The first resin insulating layer (20F) is formed on the glass substrate 4. Since glass is excellent in flatness, the first surface (22F) of the first resin insulating layer (20F) is also excellent in flatness. When no conductor circuit is formed between the front surface (5F) and the first resin insulating layer (20F), the first surface (22F) can follow the front surface (5F). The first surface (22F) can have similar flatness as the front surface (5F). In the embodiment, fine wirings can be formed on the first surface (22F). For example, the first conductor layer (30F) can have wirings having widths of 1.5 μm or more and 3.5 μm or less. A width of a space between adjacent wirings is 1.5 μm or more and 3.5 μm or less.

The first via conductors (40F) are respectively formed in the first openings (26F). The first via conductors (40F) electrically connect the through-hole conductors 8 to the first conductor layer (30F). The first via conductors (40F) electrically connect the through-hole conductors 8 to the lands (36F) of the first via conductor (40F). The first via conductors (40F) are formed of a seed layer (30Fa) and an electrolytic plating layer (30Fb) on the seed layer (30Fa). The seed layer (30Fa) forming the first via conductors (40F) and the seed layer (30Fa) forming the first conductor layer (30F) are common. The electrolytic plating layer (30Fb) forming the first via conductors (40F) and the electrolytic plating layer (30Fb) forming the first conductor layer (30F) are common. The seed layer (30Fa) forming the first via conductors (40F) is formed of a first layer (31Fa), which is formed on the inner wall surfaces (27F) of the first openings (26F) and on the upper ends (8F) of the through-hole conductors 8 exposed from the first openings (26F), and a second layer (31Fb) on the first layer (31Fa). In FIG. 1, the first via conductors (40F) are respectively connected to the upper ends (8F). The first layer (31Fa) is in contact with the upper ends (8F) of the through-hole conductors 8 and the inner wall surfaces (27F). The first via conductors (40F) are respectively directly formed on the upper ends (8F).

When the openings for the via conductors expose the front surface (5F), the first layer (31Fa) is in contact with the glass substrate 4. The openings of the first example and the openings of the second example expose the front surface (5F). Further, the openings of the first example and the openings of the second example expose the upper ends (8F). Since the first layer (31Fa) contains aluminum and glass contains oxygen, it is thought that bonding strength between the first layer (31Fa) and the substrate 4 is increased. Further, when the first layer (31Fa) contains silicon, the first layer (31Fa) and the substrate 4 contain the same element (silicon). It is thought that the bonding strength between the first layer (31Fa) and the substrate 4 is further increased. When a part of the seed layer forming the via conductors is in contact with the glass substrate 4, the via conductors are unlikely to peel off from the through-hole conductors 8 even when the wiring substrate 2 is subjected to a thermal shock. The seed layer (for example, the first layer (31Fa)) forming the via conductors that is in contact with the upper ends (8F) is preferably in contact with both the upper ends (8F) and the front surface (5F). Similarly, the seed layer (for example, the first layer) forming the via conductors that is in contact with the lower ends (8B) is preferably in contact with both the lower ends (8B) and the back surface (5B). When an adhesive layer for bonding a resin insulating layer such as the first resin insulating layer (20F) and the substrate 4 is formed between the front surface (5F) and the second surface (24F), the adhesive layer may be a part of the resin insulating layer. The adhesive layer is included in the resin insulating layer. The adhesive layer includes an organic adhesive layer and an inorganic adhesive layer. The adhesive layer is formed of an insulating material.

The second resin insulating layer (120F) is formed on the first surface (22F) of the first resin insulating layer (20F) and on the first conductor layer (30F). The first conductor layer (30F) is formed between the second resin insulating layer (120F) and the first resin insulating layer (20F). The second resin insulating layer (120F) has a first surface (122F) and a second surface (124F) on the opposite side with respect to the first surface (122F). The second surface (124F) of the second resin insulating layer (120F) faces the first conductor layer (30F). Similar to the first resin insulating layer (20F), the second resin insulating layer (120F) is formed of a resin 80 and inorganic particles 90 (first inorganic particles 91 and second inorganic particles 92). Therefore, the material of the second resin insulating layer (120F) is similar to the material of the first resin insulating layer (20F). The first surface (122F) of the second resin insulating layer (120F) is similar to the first surface (22F) of the first resin insulating layer (20F). The second resin insulating layer (120F) fills spaces between the conductor circuits forming the first conductor layer (30F).

The second resin insulating layer (120F) has second openings (126F) that expose the first conductor layer (30F). The second openings (126F) respectively expose the lands (36F). The second openings (126F) each have an inner wall surface (127F). The first openings (26F) and the second openings (126F) are similar. Therefore, the inner wall surface (27F) of each of the first openings (26F) and the inner wall surface (127F) of each of the second openings (126F) are similar.

The second conductor layer (130F) is formed on the first surface (122F) of the second resin insulating layer (120F). The second conductor layer (130F) includes a first signal wiring (132F), a second signal wiring (134F), and lands (136F). Although not illustrated in the drawings, the second conductor layer (130F) also includes conductor circuits other than the first signal wiring (132F), the second signal wiring (134F), and the lands (136F). The first signal wiring (132F) and the second signal wiring (134F) form a pair wiring. The second conductor layer (130F) and the first conductor layer (30F) are similar. Therefore, the second conductor layer (130F) is formed of a seed layer (130Fa) and an electrolytic plating layer (130Fb) on the seed layer (130Fa). The seed layer (130Fa) is formed of a first layer (131Fa) and a second layer (131Fb) on the first layer (131Fa). The first layer (131Fa) forming the second conductor layer (130F) is similar to the first layer (31Fa) forming the first conductor layer (30F). The second layer (131Fb) forming the second conductor layer (130F) is similar to the second layer (31Fb) forming the first conductor layer (30F). The electrolytic plating layer (130Fb) forming the second conductor layer (130F) is similar to the electrolytic plating layer (30Fb) forming the first conductor layer (30F).

The second via conductors (140F) are respectively formed in the second openings (126F). The second via conductors (140F) electrically connect the first conductor layer (30F) and the second conductor layer (130F). In FIG. 1, the second via conductors (140F) respectively electrically connect the lands (36F) to the lands (136F). The second via conductors (140F) and the first via conductors (40F) are similar. Therefore, the second via conductors (140F) are formed of a seed layer (130Fa) and an electrolytic plating layer (130Fb) on the seed layer (130Fa). The seed layer (130Fa) is formed of a first layer (131Fa) and a second layer (131Fb) on the first layer (131Fa). The first layer (131Fa) forming the second via conductors (140F) and the first layer (131Fa) forming the second conductor layer (130F) are common. The second layer (131Fb) forming the second via conductors (140F) and the second layer (131Fb) forming the second conductor layer (130F) are common. The electrolytic plating layer (130Fb) forming the second via conductors (140F) and the electrolytic plating layer (130Fb) forming the second conductor layer (130F) are common.

FIG. 3 illustrates an enlarged cross-sectional view of a conductor circuit in the embodiment. In FIG. 3, as a representative example of a conductor circuit in the embodiment, the first signal wiring (32F) of the first conductor layer (30F) is illustrated. As illustrated in FIG. 3, the first signal wiring (32F) is formed of the seed layer (30Fa) on the first surface (22F) of the first resin insulating layer (20F) and the electrolytic plating layer (30Fb) on the seed layer (30Fa). The seed layer (30Fa) is formed of a first layer (31Fa) on the first surface (22F) and a second layer (31Fb) on the first layer (31Fa). The first layer (31Fa) is in contact with the first surface (22F). A surface of the first layer (31Fa) facing the first surface (22F) is formed along a surface shape of the first surface (22F). The electrolytic plating layer (30Fb) is formed directly above the second layer (31*b*).

A width of the seed layer (30Fa) of the first signal wiring (32F) is smaller than a width of the electrolytic plating layer (30Fb). A width of the first signal line (32F) is smallest at a boundary portion (B) between the seed layer (30Fa) and the electrolytic plating layer (30Fb). A width (D2) of the first layer (31Fa) is larger than a width (D3) of the second layer (31Fb), and a width (D1) of the electrolytic plating layer (30Fb) is larger than the width (D2) of the first layer (31Fa). In a cross section of the first signal wiring (32F), an angle (03) between a side wall of the seed layer (30Fa) and the first surface (22F) is larger than an angle (04) between the first surface (22F) and a straight line from a bottom edge of a side wall of the electrolytic plating layer (30Fb) toward the boundary portion (B). The widths (D1, D2, D3) are measured using a cross-sectional view such as FIG. 3. The cross section used for the measurements is perpendicular to the first surface. Or, the cross section used for the measurements is perpendicular to the front surface (5F). Or, the cross section used for the measurements is perpendicular to the back surface (5B). The cross section used for the measurements is perpendicular to a side surface of a conductor circuit to be measured.

The width (D1) is a distance between two surfaces of the electrolytic plating layer (30Fb), the two surfaces extending from an upper surface of the electrolytic plating layer (30Fb) toward the first surface (22F). The upper surface of the electrolytic plating layer (30Fb) is a surface that is away from the seed layer (30Fa). The surfaces used to measure the width (D1) form side walls of the electrolytic plating layer (30Fb). A width of a conductor circuit (for example, the first signal wiring (32F)) may be represented by the width (D1). The width (D1) is measured near an upper surface of the conductor circuit. The width (D2) is measured on the first surface (22F). The width (D3) is measured at an interface between the second layer (31Fb) and the electrolytic plating layer (30Fb).

As illustrated in FIG. 3, an example of a cross-sectional shape of the electrolytic plating layer (30Fb) is substantially a hexagon. When the cross-sectional shape is substantially a hexagon, among sides forming the hexagon, a side in contact with the seed layer (30Fa) is a lower side (BL). A side opposing the lower side (BL) is an upper side (UL). Sides extending from the upper side (UL) are a first side (SL1) and a second side (SL2). The first side (SL1) and the second side (SL2) are two sides for measuring the width (D1). Sides extending from the lower side (BL) are a third side (SL3) and a fourth side (SLA). The third side (SL3) connects to the first side (SL1). The third side (SL3) is formed between the first side (SL1) and the lower side (BL). The fourth side (SL4) connects to the second side (SL2). The fourth side (SLA) is formed between the second side (SL2) and the lower side (BL). A surface including the first side (SL1) forms one side wall (side surface) of the electrolytic plating layer (30Fb). A surface including the second side (SL2) forms the other side wall (side surface) of the electrolytic plating layer (30Fb).

By making the width (D3) of the second layer (31Fb) smaller than the width (D1) of the electrolytic plating layer (30Fb) and the width (D2) of the first layer (31Fa), the sidewalls of the conductor circuit each have a recess (33F). An example of the conductor circuit is a signal wiring such as the first signal wiring (32F). A region surrounded by a side surface of the electrolytic plating layer (30Fb), the first surface (22F), and an actual side surface of the conductor circuit forms a recess (33F). The actual side surface includes a side surface of the seed layer (30Fa). The recesses (33F) are filled with the second resin insulating layer (120F). The second resin insulating layer (120F) filling a recess (33F) is referred to as a specific portion (S). The specific portion (S) contains third inorganic particles 93. Sizes of the third inorganic particles 93 contained in the specific portion (S) are smaller than sizes of the second inorganic particles 92 contained in other portions. The sizes of the third inorganic particles 93 contained in the specific portion (S) are, for example, 1.0 μm or less. A width of the specific portion (S) corresponds to "C" in FIG. 3. The width of the specific portion (S) is about 1.0 μm. A content of the resin 80 in the specific portion (S) is larger than a content of the resin contained in the other portions. Therefore, a stress generated at an interface between the seed layer (30Fa) and the electrolytic plating layer (30Fb) is relaxed.

FIG. 3 illustrates the first signal wiring (32F). However, other conductor circuits (the second signal wiring (34F) and the land (36F), and the like) in the first conductor layer (30F) also each have a similar structure to the first signal wiring (32F). The conductor circuits (the first signal wiring (132F), the second signal wiring (134F), and the land (136F), and the like) in the second conductor layer (130F) also each have a similar structure to the first signal wiring (32F).

The back side build-up layer (300B) includes back side resin insulating layers, back side conductor layers, and back side via conductors that penetrate the back side resin insulating layers. The back side resin insulating layers and the back side conductor layers are alternately laminated. The back side conductor layers and the back side via conductors are electrically connected to the through-hole conductors 8. The back side resin insulating layers in FIG. 1 are a first resin insulating layer (20B) having a first surface (22B) and a second surface (24B) and a second resin insulating layer (120B) having a first surface (122B) and a second surface (124B). The back side conductor layers are a first conductor layer (30B) and a second conductor layer (130B). The first conductor layer (30B) and the second conductor layer (130B) include first signal wirings (32B, 132B) and second signal wirings (34B, 134B). The back side via conductors are first via conductors (40B) and second via conductors (140B).

The front side build-up layer (300F) and the back side build-up layer (300B) are similar. Therefore, the front side resin insulating layers forming the front side build-up layer (300F) and the back side resin insulating layers forming the back side build-up layer (300B) are similar. The back side resin insulating layers are each formed of a resin 80 and inorganic particles 90. The back side resin insulating layers contain the first inorganic 91 and the second inorganic particles 92. The first surface of each of the resin insulating layers is formed only of the resin. The front side conductor layers and the back side conductor layers are similar. The openings for the front side via conductors and the openings for the back side via conductors are similar. The inner wall surface of each of the openings for the via conductors is formed of the surface (exposed surface) (80*a*) of the resin 80 and the exposed surfaces (91*b*) of the inorganic particles. The front side via conductors and the back side via conductors are similar.

Although not illustrated in the drawings, each side of the wiring substrate 2 has a length of 50 mm or more. The length of each side is preferably 100 mm or more. The length of each side is 250 mm or less. A length of a signal wiring formed according to the embodiment is 5 mm or more. The length of the signal wiring may be 10 mm or more and 20 mm or less.

Method for Manufacturing Wiring Substrate

Figure 4A:
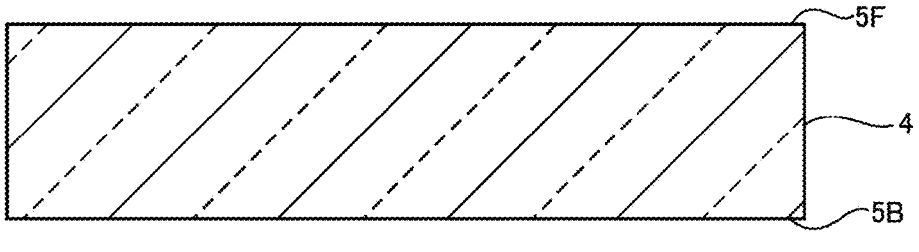
FIG. 4A is a cross-sectional view schematically illustrating a method for manufacturing a wiring substrate according to an embodiment of the present invention.
Figure 4B:
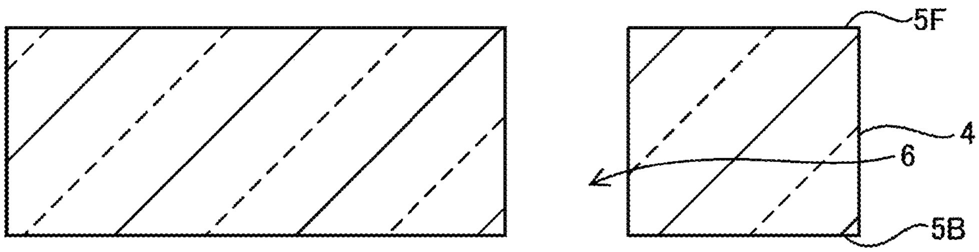
FIG. 4B is a cross-sectional view schematically illustrating a method for manufacturing a wiring substrate according to an embodiment of the present invention.
Figure 4C:
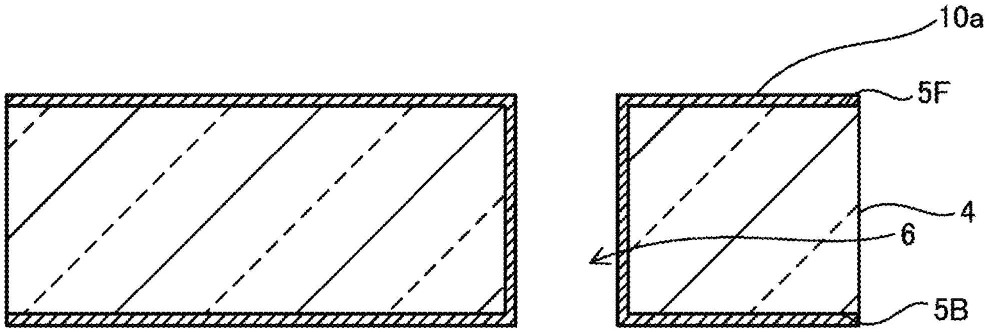
FIG. 4C is a cross-sectional view schematically illustrating a method for manufacturing a wiring substrate according to an embodiment of the present invention.
Figure 4D:
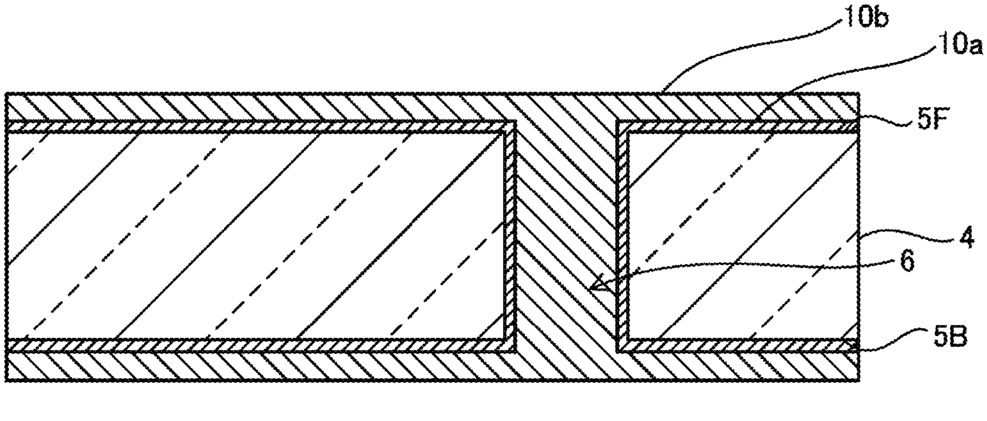
FIG. 4D is a cross-sectional view schematically illustrating a method for manufacturing a wiring substrate according to an embodiment of the present invention.
Figure 4E:
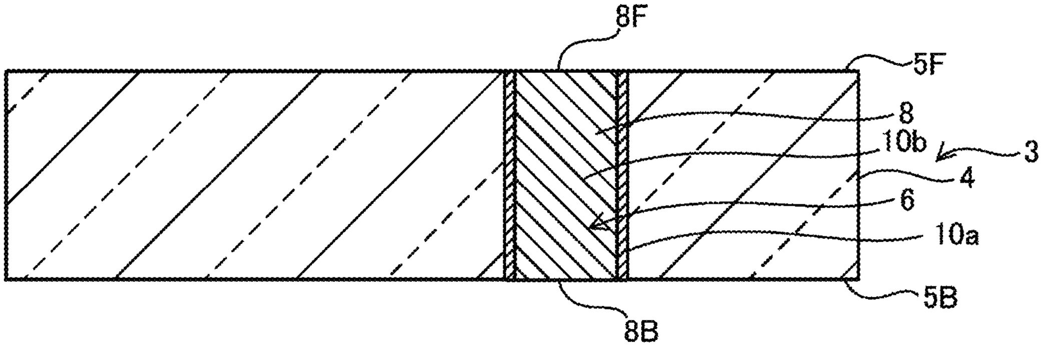
FIG. 4E is a cross-sectional view schematically illustrating a method for manufacturing a wiring substrate according to an embodiment of the present invention.
Figure 4F:
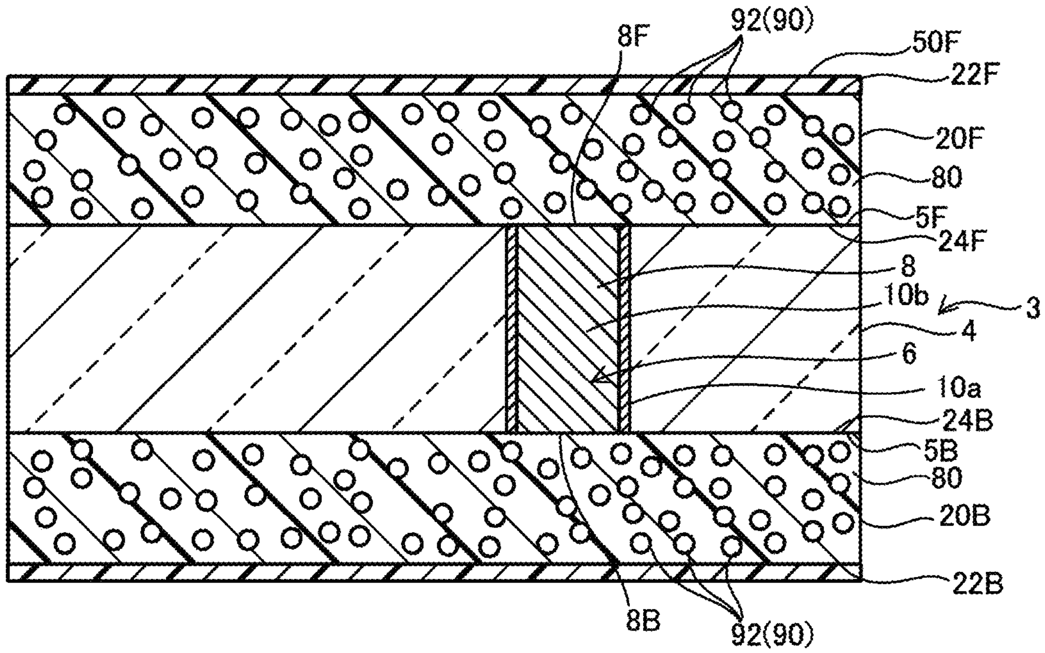
FIG. 4F is a cross-sectional view schematically illustrating a method for manufacturing a wiring substrate according to an embodiment of the present invention.
Figure 4G:
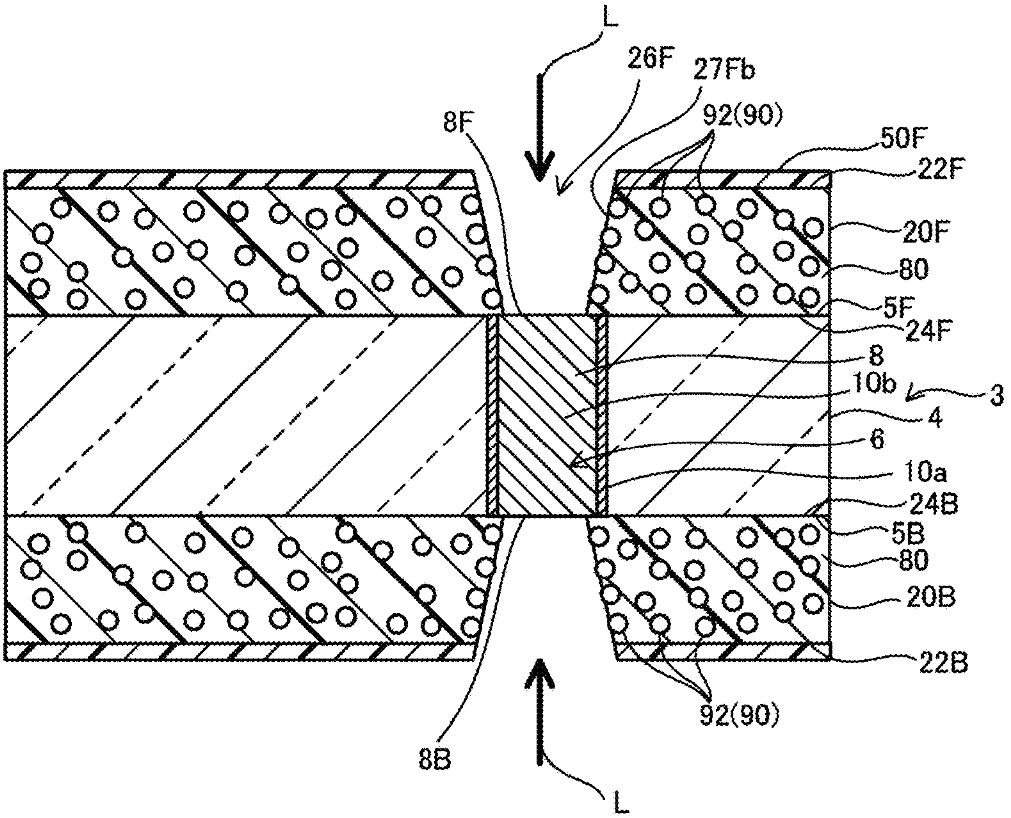
FIG. 4G is a cross-sectional view schematically illustrating a method for manufacturing a wiring substrate according to an embodiment of the present invention.
Figure 4H:
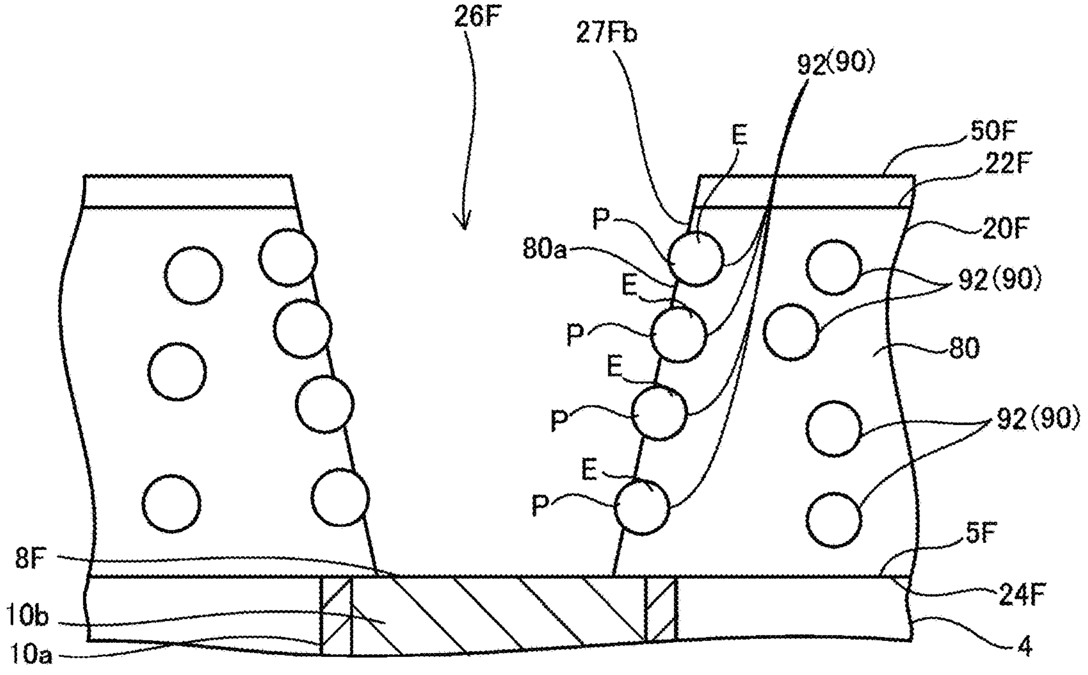
FIG. 4H is a cross-sectional view schematically illustrating a method for manufacturing a wiring substrate according to an embodiment of the present invention.

FIGS. 4A-4K illustrate a method for manufacturing the wiring substrate 2 of the embodiment. FIGS. 4A-4G and 4I-4K are cross-sectional views. FIG. 4H is an enlarged cross-sectional view. FIG. 4A illustrates the glass substrate 4. The substrate 4 has the front surface (5F) and the back surface (5B). As illustrated in FIG. 4B, the through holes 6 each extending from the front surface (5F) to the back surface (5B) are formed. The through holes 6 penetrate the substrate 4. Laser is irradiated from the front surface (5F) side of the substrate 4. After that, the substrate 4 is immersed in a hydrofluoric acid. The through holes 6 are formed.

As illustrated in FIG. 4C, the seed layer (10*a*) is formed. The seed layer (10*a*) is formed by electroless plating. The seed layer (10*a*) is formed on the inner wall surfaces of the through holes 6, on the front surface (5F), and on the back surface (5B).

As illustrated in FIG. 4D, the electrolytic plating layer (10*b*) is formed. The electrolytic plating layer (10*b*) is formed on the seed layer (10*a*). The electrolytic plating layer (10*b*) fills the through holes 6.

As illustrated in FIG. 4E, the electrolytic plating layer (10*b*) and the seed layer (10*a*) on the front surface (5F) are removed by polishing. The electrolytic plating layer (10*b*) and the seed layer (10*a*) on the back surface (5B) are removed by polishing. The front surface (5F) and the back surface (5B) of the substrate 4 are exposed. The through-hole conductors 8 are formed by the seed layer (10*a*) on the inner wall surfaces of the through holes 6 and the electrolytic plating layer (10*b*) on the seed layer (10*a*). The upper ends (8F) of the through-hole conductors 8 are exposed from the front surface (5F). The lower ends (8B) of the through-hole conductors 8 are exposed from the back surface (5B). Surfaces forming the upper ends (8F) and the front surface (5F) form the same flat surface. Surfaces forming the lower ends (8B) and the back surface (5B) form the same flat surface. The core substrate 3 (FIG. 1) is formed. The core substrate 3 in FIG. 1 has no conductor circuit on the front surface (5F). The core substrate 3 in FIG. 1 has no conductor circuit on the back surface (5B).

The front side build-up layer (300F) and the back side build-up layer (300B) are formed on core substrate 3 using similar methods. The method for forming the front side build-up layer (300F) is described below. The back side build-up layer (300B) is also depicted in the drawings.

As illustrated in FIG. 4F, the first resin insulating layer (20F) and a protective film (50F) are formed on the front surface (5F) of the substrate 4 and on the upper ends (8F). The second surface (24F) of the first resin insulating layer (20F) faces the front surface (5F) of the substrate 4. The protective film (50F) is formed on the first surface (22F) of the first resin insulating layer (20F). The first surface (22F) of the first resin insulating layer (20F) is formed only of the resin 80. No inorganic particles 90 are exposed from the first surface (22F). The first surface (22F) does not include surfaces of the inorganic particles 90. No unevenness is formed on the first surface (22F) of the first resin insulating layer (20F). The first resin insulating layer (20F) is formed on a flat surface formed by the front surface (5F) and the upper ends (8F). Therefore, the first surface (22F) is formed as a substantially flat surface. The front surface (5F) and the first surface (22F) are substantially parallel.

As illustrated in FIG. 4G, laser (L) is irradiated from above the protective film (50F). The laser (L) penetrates the protective film (50F) and the first resin insulating layer (20F) at the same time. The first openings (26F) for the via conductors reaching the upper ends (8F) of the through-hole conductors 8 are formed. The laser (L) is, for example, UV laser, or $CO_2$ laser. The upper ends (8F) of the through-hole conductors 8 are exposed from the first openings (26F). When the first openings (26F) are formed, the first surface (22F) is covered by the protective film (50F). When the first openings (26F) are formed, even when the resin scatters, adherence of the resin to the first surface (22F) is suppressed.

The first surface (22F) is excellent in flatness. When the laser (L) is irradiated to the first surface (22F), the laser (L) is unlikely to be diffusely reflected. When each of the first openings (26F) is formed, a focus position of the laser (L) is likely to match. Openings for via conductors with small diameters can be formed. The diameters of the openings for the via conductors are substantially equal to each other. For example, openings for via conductors having diameters of 15 μm or more and 35 μm or less can be formed. The diameters are measured on the first surface (22F).

FIG. 4H illustrates an inner wall surface (27Fb) of each of the first openings (26F) after the laser irradiation. The inner wall surface (27Fb) is formed of the resin 80 and the inorganic particles 90 protruding from the resin 80. In order to control a shape of the inner wall surface, the inner wall surface (27Fb) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (27Fb) after the laser irradiation with a chemical. Or, the inorganic particles 90 protruding from the resin 80 are selectively removed by treating the inner wall surface (27Fb) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27Fb) after the laser irradiation, the first inorganic particles 91 having the flat parts (91*a*) (see FIG. 2) are obtained. By controlling conditions for treating the inner wall surface (27Fb) after the laser irradiation, the shape of the inner wall surface (27F) can be controlled. Examples of the conditions are a temperature, a concentration, a time, a type of gas, and a pressure. The etching rate of the inorganic particles 90 and the etching rate of the resin are controlled.

By irradiating the first resin insulating layer (20F) with the laser (L), some of the second inorganic particles 92 embedded in the resin 80 form the inner wall surface (27Fb) after the laser irradiation. The second inorganic particles 92 forming the inner wall surface (27Fb) after the laser irradiation are each formed of a protruding portion (P) protruding from the resin 80 and a portion (E) embedded in the resin 80. The inner wall surface (27Fb) after the laser irradiation is treated. For example, the inner wall surface (27Fb) is treated with plasma of a gas containing tetrafluoromethane. The protruding portions (P) are selectively removed and the inner wall surface (27F) of the embodiment (FIGS. 1 and 2) is formed. The first inorganic particles 91 are formed from the second inorganic particles 92. By selectively removing the protruding portions (P), the first inorganic particles 91 having the flat parts (91*a*) are formed. The flat parts (91*a*) are flat surfaces. When the second inorganic particles 92 having spherical shapes are cut along a flat surface, the shapes of the first inorganic particles 91 are obtained. The inner wall surface (27F) is formed of the flat parts (91*a*) and the surface (80*a*) of the resin 80, and exposed surfaces (91*b*) of the flat parts (91*a*) and the surface (80*a*) of the resin 80 are substantially positioned on the same flat surface. For example, when the seed layer (30Fa) is formed on the inner wall surface (27Fb) by sputtering, the protruding portions (P) inhibit growth of a sputtered film (sputtering-deposited film). For example, a continuous seed layer (30Fa) is not formed on the inner wall surface (27Fb). Or, the thickness of the seed layer (30Fa) is increased. A fine conductor circuit cannot be formed. In the embodiment, the projecting portions (P) are removed. The thickness of the seed layer (30Fa) formed by sputtering can be reduced. Even when the seed layer (30Fa) formed by sputtering is thin, a continuous seed layer (30Fa) can be obtained.

Forming the first openings (26F) includes forming the inorganic particles 90 (the second inorganic particles 92) having the protruding portions (P). The protruding portions (P) protrude from the resin 80 that forms the inner wall surface (27Fb) of each of the first openings (26F). The first inorganic particles 91 are formed by removing the protruding portions (P) of the inorganic particles 90 (the second inorganic particles 92). The inner wall surface (27F) of each of the first openings (26F) includes the exposed surfaces (91*b*) of the first inorganic particles 91. The exposed surfaces (91*b*) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The actual inner wall surface (27F) of each of the first openings (26F) is a substantially curved surface. Since the flat parts (91*a*) are formed by removing the protruding portions (P), the exposed surfaces (91*b*) of the flat parts (91*a*) each include a curved surface. That is, forming a common surface with the flat parts (91*a*) and the resin 80 includes forming the inner wall surface (27F) formed with a substantially curved surface.

The inner wall surface (27F) can have steps between the exposed surfaces (91*b*) of the first inorganic particles 91 and the surface (80*a*) of the resin 80 surrounding the first inorganic particles 91 that have the exposed surfaces (91*b*). The exposed surfaces (91*b*) are recessed from the surface (80*a*) of the resin 80. Or, the exposed surfaces (91*b*) protrude from the surface (80*a*) of the resin 80. The steps (distances from the exposed surfaces (91*b*) to the surface (80*a*) of the resin 80) are 5 μm or less. The steps are preferably 3 μm or less. The steps are more preferably 1.5 μm or less. Even when the steps are formed, since the steps are small, the exposed surfaces (91*b*) and the surface (80*a*) of the resin 80 form a substantially common surface.

No unevenness is formed on the inner wall surface (27F). The inner wall surface (27F) is formed smooth. By controlling the conditions for treating the inner wall surface (27Fb) after the laser irradiation, the size of the unevenness is controlled.

Insides of the first openings (26F) are cleaned. By cleaning the insides of the first openings (26F), resin residues generated when the first openings (26F) are formed are removed. The cleaning of the insides of the first openings (26F) is performed using plasma. That is, the cleaning is performed with a dry process. The cleaning includes a desmear treatment.

When the insides of the first openings (26F) are cleaned, the first surface (22F) of the resin insulating layer (20F) is covered by the protective film (50F). The first surface (22F) is not affected by the plasma. The first surface (22F) is formed only of the resin 80. No inorganic particles 90 are exposed from the first surface (22F). The first surface (22F) does not include surfaces of the inorganic particles 90. The first surface (22F) of the first resin insulating layer (20F) has no unevenness. The first surface (22F) is formed smooth.

When treating the inner wall surface (27Fb) after the laser irradiation includes cleaning the insides of the first openings (26F), cleaning the insides of the first openings (26F) can be omitted.

Figure 4I:
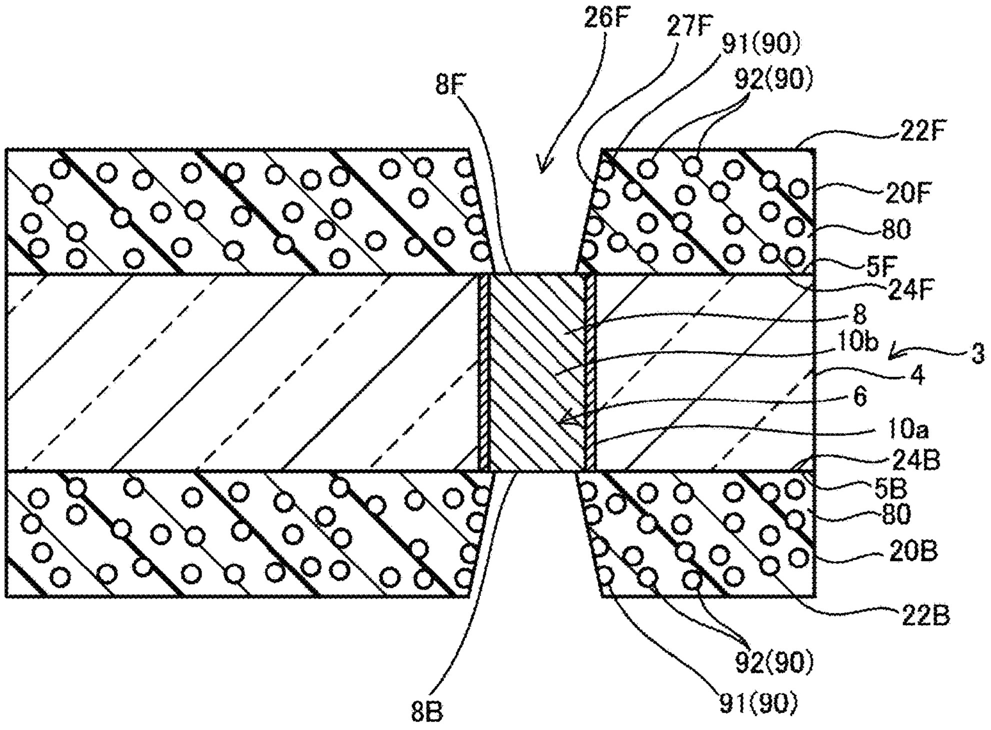
FIG. 4I is a cross-sectional view schematically illustrating a method for manufacturing a wiring substrate according to an embodiment of the present invention.

As illustrated in FIG. 4I, after cleaning the insides of the first openings (26F), the protective film (50F) is removed from the first resin insulating layer (20F). When treating the inner wall surface (27Fb) after the laser irradiation includes cleaning the insides of the first openings (26F), the protective film (50F) is removed from the first resin insulating layer (20F) after treating the inner wall surface (27Fb) after the laser irradiation. When the inner wall surface (27Fb) after the laser irradiation is treated, the protective film (50F) covers the first surface (22F) of the first resin insulating layer (20F). After the protective film (50F) is removed, the first surface (22F) of the first resin insulating layer (20F) is not roughened.

Figure 4J:
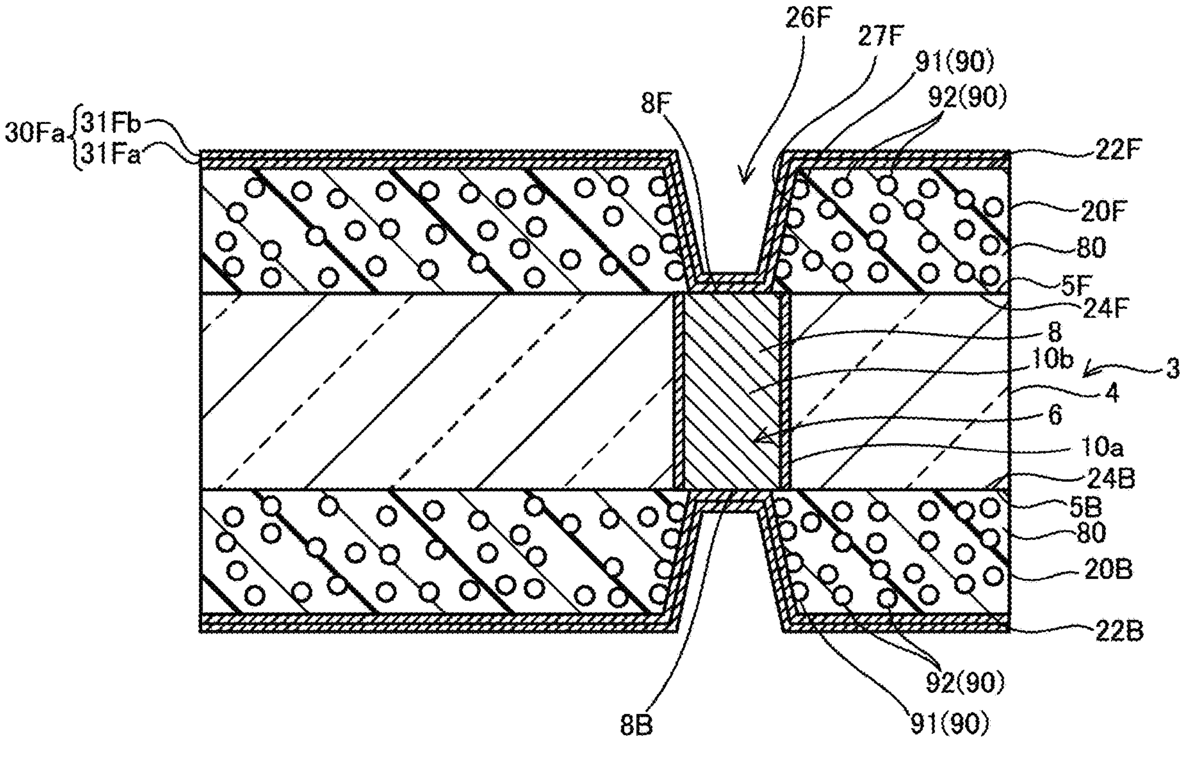
FIG. 4J is a cross-sectional view schematically illustrating a method for manufacturing a wiring substrate according to an embodiment of the present invention.

As illustrated in FIG. 4J, the seed layer (30Fa) is formed on the first surface (22F) of the first resin insulating layer (20F). The seed layer (30Fa) is formed by sputtering. The formation of the seed layer (30Fa) is performed with a dry process. The seed layer (30Fa) is also formed on the upper ends (8F) of the through-hole conductors 8 exposed from the first openings (26F) and on the inner wall surfaces (27F) of the first openings (26F). The seed layer (30Fa) is mainly formed of copper. The first layer (31Fa) is formed on the first surface (22F) by sputtering. The first layer (31Fa) is formed by sputtering on the inner wall surfaces (27F) exposed from the first openings (26F) and on the upper ends (8F) of the through-hole conductors 8. The second layer (31Fb) is formed on the first layer (31Fa) by sputtering.

After the formation of the first layer (31Fa), the first layer (31Fa) may be subjected to a heat treatment. For example, temperature of the heat treatment is 120 degrees and time of the heat treatment is 1 hour. After the formation of the second layer (31Fb), the second layer (31Fb) also may be subjected to a heat treatment. For example, temperature of the heat treatment is 80 degrees and time of the heat treatment is 30 minutes. After the formation of the second layer (31Fb), when a heat treatment is performed, the heat treatment is also performed on the first layer (31Fa).

The first layer (31Fa) of the seed layer (30Fa) is formed of a copper alloy containing copper, aluminum and silicon. Aluminum has high ductility and high malleability. Therefore, adhesion between the first resin insulating layer (20F) and the first layer (31Fa) is high. It is thought that, even when the first resin insulating layer (20F) expands and contracts due to heat cycles, the seed layer (30Fa) containing aluminum can follow the expansion and contraction. Even when the first surface (22F) is smooth, the seed layer (30Fa) is unlikely to peel off from the first resin insulating layer (20F). It is thought that aluminum is easily oxidized. It is thought that, when the first inorganic particles 91 are inorganic particles 90 containing oxygen, the first layer (31Fa) formed on the inner wall surface (27F) of each of the first openings (26F) adheres to the first inorganic particles 91 via the oxygen in the inorganic particles 90 forming the inner wall surface (27F). The first layer (31Fa) is strongly bonded to the inner wall surface (27F). Adhesion between the inner wall surface (27F) of each of the first openings (26F) and the first layer (31Fa) can be increased. The seed layer (30Fa) is unlikely to peel off from the inner wall surface (27F). It is preferable that the inorganic particles 90 forming the inner wall surface (27F) contain oxygen. The second layer (31Fb) is formed of copper.

The first surface (22F) is excellent in flatness. When the seed layer (30Fa) is formed on the first surface (22F) by sputtering, a distance between a target and the first surface (22F) is substantially constant. A seed layer (30Fa) having a substantially uniform thickness can be formed.

The thickness of the seed layer (30Fa) is 0.02 μm or more and 1.0 μm or less. A more preferable example is 0.03 μm or more and 0.5 μm or less. An even more preferable example is 0.05 μm or more and 0.3 μm or less. The first surface (22F) has an arithmetic mean roughness (Ra) of 0.02 μm or more and 0.06 μm or less. When the thickness of the seed layer (30Fa) is less than 0.02 μm, it is difficult to uniformly form the seed layer (30Fa) over the entire first surface (22F) of the first resin insulating layer (20F). When the thickness is larger than 1.0 μm, it is difficult to control the width of the electrolytic plating layer (30Fb) when the seed layer (30Fa) is removed. The thickness of the first layer (31Fa) is 0.01 μm or more and 0.5 μm or less. A more preferable example is 0.02 μm or more and 0.3 μm or less. An even more preferable example is 0.03 μm or more and 0.1 μm or less. When the thickness of the first layer (31Fa) is less than 0.01 μm, the adhesion between the first layer (31Fa) and the first resin insulating layer (20F) decreases. When the thickness of the first layer (31Fa) is larger than 0.5 μm, wiring resistance increases. The thickness of the second layer (31Fb) is 0.01 μm or more and 0.9 μm or less. A more preferable example is 0.02 μm or more and 0.3 μm or less. An even more preferable example is 0.03 μm or more and 0.2 μm or less. When the thickness of the second layer (31Fb) is less than 0.01 μm, wiring resistance increases. When the thickness of the second layer (31Fb) is larger than 0.9 μm, it is difficult to control the width of the electrolytic plating layer (30Fb) when the seed layer (30Fa) is removed. The seed layer (30Fa) is formed along a surface shape of the first surface (22F). The seed layer (30Fa) that forms a conductor circuit in the first conductor layer (30F) does not extend to an inner side of the first resin insulating layer (20F). When the seed layer (30Fa) is removed, an etching amount can be reduced. A conductive circuit is unlikely to be excessively etched. The widths of the conductor circuit can be made close to design values.

A plating resist is formed on the seed layer (30Fa). The plating resist has openings for forming the first signal wiring (32F), the second signal wiring (34F), and the lands (36F) (FIG. 1).

The electrolytic plating layer (30Fb) is formed on the seed layer (30Fa) exposed from the plating resist. The thickness of the electrolytic plating layer (30Fb) is 5 μm or more and 20 μm or less. The electrolytic plating layer (30Fb) is formed of an electrolytic copper plating layer. The electrolytic plating layer (30Fb) fills the first openings (26F). The first signal wiring (32F), the second signal wiring (34F), and the lands (36F) (FIG. 1) are formed by the seed layer (30Fa) and the electrolytic plating layer (30Fb) on the first surface (22F). The first conductor layer (30F) is formed. The first via conductors (40F) (FIG. 1) are formed by the seed layer (30Fa) and the electrolytic plating layer (30Fb) in the first openings (26F). The first via conductors (40F) connect the through-hole conductors 8 and the lands (36F). The first signal wiring (32F) and the second signal wiring (34F) form a pair wiring.

Figure 4K:
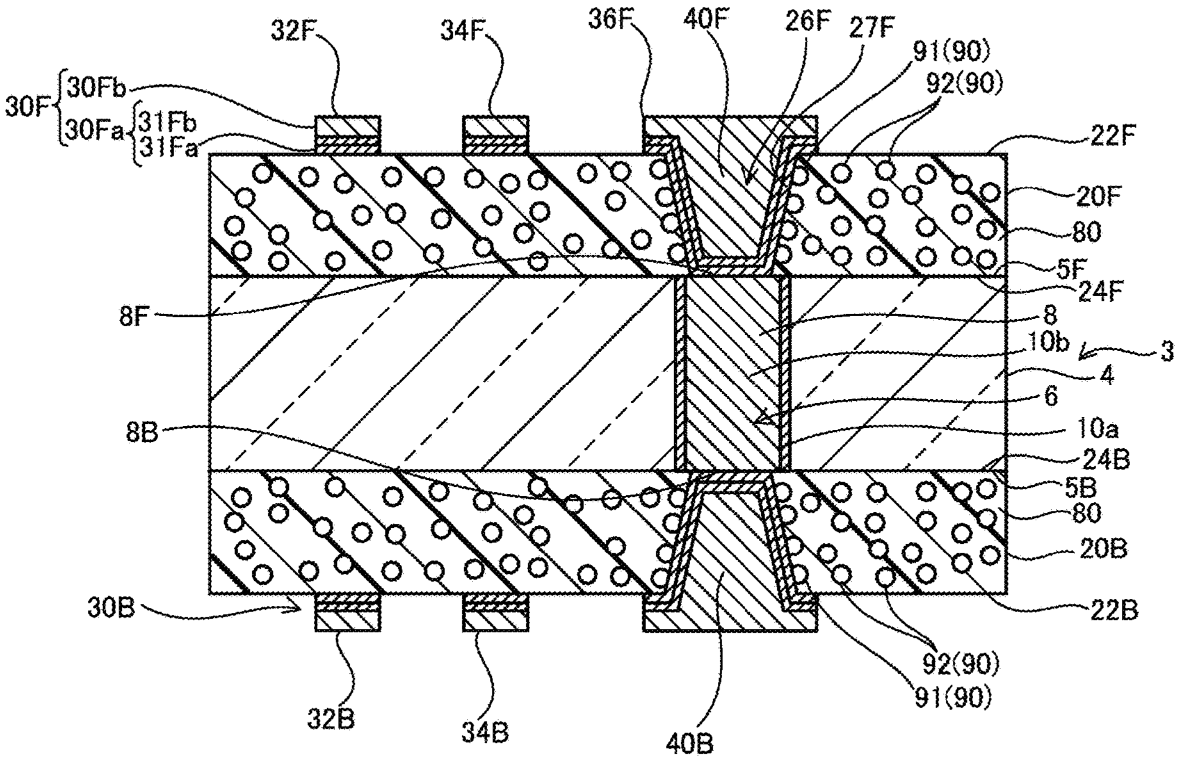
FIG. 4K is a cross-sectional view schematically illustrating a method for manufacturing a wiring substrate according to an embodiment of the present invention.

The plating resist is removed. The seed layer (30Fa) exposed from the electrolytic plating layer (30Fb) is removed by etching. As illustrated in FIG. 4K, the first conductor layer (30F) and the first via conductors (40F) are formed at the same time.

An etching rate (R2) of the second layer (31Fb) is higher than an etching rate (R1) of the first layer (31Fa). The etching rate (R1) of the first layer (31Fa) is higher than an etching rate (RE) of the electrolytic plating layer (30Fb). An etching rate (RS) of the seed layer (30Fa) is higher than the etching rate (RE) of the electrolytic plating layer (30Fb). For example, a ratio (R2/RE) of the etching rate (R2) of the second layer (31Fb) to the etching rate (RE) of the electrolytic plating layer (30Fb) is 1.2 or more and 1.5 or less. A ratio (R1/RE) of the etching rate (R1) of the first layer (31Fa) to the etching rate (RE) of the electrolytic plating layer (30Fb) is 1.1 or more and 1.4 or less. A ratio (R2/R1) of the etching rate (R2) of the second layer (31Fb) to the etching rate (R1) of the first layer (31Fa) is 1.1 or more and 1.5 or less. Therefore, as illustrated in FIG. 3, the width (D2) of the first layer (31Fa) is larger than the width (D3) of the second layer (31Fb). The width (D1) of the electrolytic plating layer (30Fb) is larger than the width (D2) of the first layer (31Fa). When the seed layer (30Fa) is removed, an etching amount of the electrolytic plating layer (30Fb) is small. The conductive circuit is unlikely to be excessively etched. The widths of the conductor circuit can be made close to design values. As an etching solution for removing the seed layer (30Fa), an etching solution that dissolves the second layer (31Fb) more than the first layer (31Fa) is preferable. The wiring width (distance between the sidewalls of the wiring) is smallest at the boundary portion (B) between the second layer (31Fb) and the electrolytic plating layer (30Fb). Since a stress is the largest at the boundary portion (B), the adhesion between the first layer (31Fa) and the first resin insulating layer (20F) is improved.

The layers (31Fa, 31Fb, 30Fb) forming the conductor circuit have different etching rates. It is speculated that structural ratios ((amorphous structure)/(crystalline structure)) of the layers (31Fa, 31Fb, 30Fb) are related to the differences in the etching rates. This is because an amorphous structure is likely to have lattice defects. Therefore, a layer with a large structural ratio is likely to have a large etching rate. Examples of devices for determining structural ratios include transmission electron microscopy and X-ray diffraction. For example, a structural ratio is calculated using volumes of the two. Or, a structural ratio is calculated using areas of the two included in a cross section. When areas are used, an area ratio ((area of amorphous structure)/(area of crystalline structure)) is used as a representative value of the structural ratio.

It is thought that the higher the structural ratio, the higher the etching rate. Therefore, the structural ratio of the second layer (31Fb) is expected to be larger than that of the first layer (31Fa). The structural ratio of the first layer (31Fa) is expected to be larger than that of the electrolytic plating layer (30Fb). It is thought that factors such as amount of heat, composition, thickness, time, formation method, density, and crystallinity affect the structural ratio. The amount of heat applied to the first layer (31Fa) is larger than the amount of heat applied to the second layer (31Fb). The thickness of the first layer (31Fa) and the second layer (31Fb) are substantially equal. The thickness of the electrolytic plating layer (30Fb) is significantly larger than the thickness of the first layer (31Fa). The second layer (31Fb) and the electrolytic plating layer (30Fb) are formed of copper, and the first layer (31Fa) is formed of a copper alloy. The first layer (31Fa) is formed on a resin. The second layer (31Fb) is formed on the first layer (31Fa), which is formed of a copper alloy. The electrolytic plating layer (30Fb) is formed on the second layer (31Fb), which is formed of copper. Among the first layer (31Fa), the second layer (31Fb), and the electrolytic plating layer (30Fb), the first layer (31Fa) is formed first. The first layer (31Fa) and the second layer (31Fb) are formed by sputtering. The electrolytic plating layer (30Fb) is formed by electrolytic plating. There are commonalities and differences among the layers (31Fa, 31Fb, 30Fb) that form the conductor circuit. It is thought that the etching rates of the layers (31Fa, 31Fb, 30Fb) can be controlled by controlling the factors affecting the structural ratios.

Since the flat parts (91*a*) of the first inorganic particles 91 form the inner wall surface (27F), the thickness of the first layer (31Fa) can be reduced. The thickness of the first layer (31Fa) is sufficiently smaller than the thickness of the electrolytic plating layer (30Fb). Therefore, orientation of the particles forming the first layer (31Fa) tends to be lower than orientation of the particles forming the electrolytic plating layer (30Fb). Or, a density of the first layer (31Fa) tends to be smaller than a density of the electrolytic plating layer (30Fb). Or, crystallinity of the first layer (31Fa) tends to be lower than crystallinity of the electrolytic plating layer (30Fb). Since the flat parts (91*a*) of the first inorganic particles 91 form the inner wall surface (27F), the thickness of the second layer (31Fb) can be reduced. The thickness of the second layer (31Fb) is sufficiently smaller than the thickness of the electrolytic plating layer (30Fb). Therefore, orientation of the particles forming the second layer (31Fb) tends to be lower than the orientation of the particles forming the electrolytic plating layer (30Fb). Or, a density of the second layer (31Fb) tends to be smaller than the density of the electrolytic plating layer (30Fb). Or, crystallinity of the second layer (31Fb) tends to be lower than the crystallinity of the electrolytic plating layer (30Fb). Therefore, the etching rates of the first layer (31Fa) and the second layer (31Fb) are higher than the etching rate of the electrolytic plating layer (30Fb). When the seed layer (30Fa) exposed from the electrolytic plating layer (30Fb) is removed, the width (D1) of the electrolytic plating layer (30Fb) is larger than the width (D2) of the first layer (31Fa). The width (D1) of the electrolytic plating layer (30Fb) is larger than the width (D3) of the second layer (31Fb). The etching rate of the electrolytic plating layer (30Fb) is smaller than the etching rate of the seed layer (30Fa). Therefore, an amount of a dissolution component in an etching solution consumed for dissolving the electrolytic plating layer (30Fb) is small. According to the embodiment, a dissolution component sufficiently reaches the seed layer (30Fa). The seed layer (30Fa) efficiently dissolves. A signal wiring having a width of a target value can be formed. The first layer (31Fa) is covered by the second layer (31Fb). A dissolution component is consumed for dissolving the second layer (31Fb). Therefore, a dissolution amount of the first layer (31Fa) can be smaller than a dissolution amount of the second layer (31Fb). When the seed layer (30Fa) exposed from the electrolytic plating layer (30Fb) is removed, the width (D2) of the first layer (31Fa) is larger than the width (D3) of the second layer (31Fb).

The etching rate of the seed layer (30Fa) is higher than the etching rate of the electrolytic plating layer (30Fb). Therefore, in the cross section of the first signal wiring (32F), the angle (03) is larger than the angle (04). The boundary portion (B) has a small depth. Stress concentration is relaxed.

The second resin insulating layer (120F) is formed on the first surface (22F) of the first resin insulating layer (20F) and on the first conductor layer (30F). The second conductor layer (130F) is formed on the first surface (122F) of the second resin insulating layer (120F). The second via conductors (140F) are formed in the second openings (126F) of the second resin insulating layer (120F). The second resin insulating layer (120F) is formed using the same method as the first resin insulating layer (20F). The second conductor layer (130F) is formed using the same method as the first conductor layer (30F). The second via conductors (140F) are formed using the same method as the first via conductors (40F). The wiring substrate 2 of the embodiment (FIG. 1) is obtained.

By making the width (D3) of the second layer (31Fb) smaller than the width (D1) of the electrolytic plating layer (30Fb) and the width (D2) of the first layer (31Fa), the sidewalls of the first signal wiring (32F) have the recesses (33F). A stress caused by a difference in thermal expansion coefficient between the glass substrate 4 and the resin insulating layers (the first resin insulating layer (20F) and the second resin insulating layer (120F)) is unlikely to be transmitted to the first resin insulating layer (20F) along the side walls of the first signal wiring (32F). The stress is dispersed by the recesses (33F). A crack along an extension of an interface between a side wall of the first signal wiring (32F) and the second resin insulating layer (120F) is unlikely to occur in the first resin insulating layer (20F). The width (D2) of the first layer (31Fa) is larger than the width (D3) of the second layer (31Fb). Since the side walls of the first signal wiring (32F) have the recesses (33F), a contact area between the first signal wiring (32F) and the second resin insulating layer (120F) is large. The second resin insulating layer (120F) is unlikely to peel off from the first signal wiring (32F).

A surface of the first conductor layer (30F) facing the first surface (22F) is formed along a surface shape of the first surface (22F). Therefore, the seed layer (30Fa) forming the conductor circuits (the first signal wiring (32F), the second signal wiring (34F) and the land (36F)) in the first conductor layer (30F) does not extend to an inner side of the first surface (22F) of the first resin insulating layer (20F). A thin seed layer (30Fa) is formed. Variation in the thickness of the seed layer (30Fa) is small. When the seed layer (30Fa) is removed, an etching amount is small. A conductive circuit is unlikely to be excessively etched. The widths of the conductor circuit can be made close to design values.

The core substrate 3 of the wiring substrate 2 of the embodiment (FIG. 1) includes the glass substrate 4. The glass substrate 4 is excellent in flatness. The first surface (22F, 22B) of the first resin insulating layer (20F, 20B) is formed of the resin 80. The first surface (22F, 22B) of the first resin insulating layer (20F, 20B) is formed only of the resin 80. The first surface (22F, 22B) of the first resin insulating layer (20F, 20B) does not include surfaces of the inorganic particles 90. The first surfaces (22F, 22B) of the first resin insulating layers (20F, 20B) are excellent in flatness and smoothness. Fine signal wirings (32F, 32B, 34F, 34B) can be formed on the first surfaces (22F, 22B) of the first resin insulating layers (20F, 20B). The first surfaces (122F, 122B) of the second resin insulating layers (120F, 120B) are similar to the first surfaces (22F, 22B) of the first resin insulating layers (20F, 20B). Therefore, fine signal wirings (132F, 132B, 134F, 134B) can be formed on the first surfaces (122F, 122B) of the second resin insulating layers (120F, 120B). The L/S of a signal wiring formed according to the embodiment is, for example, less than 5 μm/5 μm. The L/S of a signal wiring is preferably 1.5 μm/1.5 μm or more and 3.5 μm/3.5 μm or less. L means a width of a signal wiring, and S means a width of a space between adjacent signal wirings.

In the embodiment, the first layer formed on the inner wall surface is formed by sputtering. The resin insulating layer on the glass substrate 4 is unlikely to warp. Gaps that inhibit growth of a sputtered film are unlikely to occur between the resin 80 forming the inner wall surface of each of the openings for the via conductors and the first inorganic particles. The inner wall surface of the opening is unlikely to have large undulation or large unevenness. Even when the sputtered film on the inner wall surface has a small thickness, a continuous sputtered film can be formed. A film formed by sputtering can be referred to as a sputtered film.

The inner wall surface 27 of each of the openings (the first openings and the second openings) for the via conductors is formed of the resin 80 and the exposed surfaces (91*b*) of the flat parts (91*a*) of the first inorganic particles 91. It is thought that, when the first layer is formed, particles forming the sputtered film adhere to the first inorganic particles 91. It is thought that the particles forming the sputtered film are not embedded in the first inorganic particles 91. A thin and continuous seed layer can be formed on the inner wall surface. According to the embodiment, a thin and continuous seed layer can be formed on the first surface and the inner wall surface. When the seed layer is removed, an etching amount is small. Therefore, an etching amount of the electrolytic plating layer is small. A signal wiring has a width as designed. Fine signal wirings can be formed. A high quality wiring substrate 2 is provided.

In the wiring substrate 2 (FIG. 1) of the embodiment, the first surface (22F, 22B) of the first resin insulating layer (20F, 20B) is formed of the resin 80. No inorganic particles 90 are exposed from the first surface (22F, 22B). No unevenness is formed on the first surface (22F, 22B). An increase in standard deviation of a relative permittivity in a portion near the first surfaces (22F, 22B) of the first resin insulating layers (20F, 20B) is suppressed. The relative permittivity of the first surfaces (22F, 22B) does not significantly vary depending on a location. Even when the first signal wiring (32F, 32B) and the second signal wiring (34F, 34B) are in contact with the first surface (22F, 22B), a difference in propagation speed of an electrical signal between the first signal wiring (32F, 32B) and the second signal wiring (34F, 34B) can be reduced. Therefore, in the wiring substrate 2 of the embodiment, noise is suppressed. Even when a logic IC is mounted on the wiring substrate 2 of the embodiment, data transmitted via the first signal wiring (32F, 32B) and data transmitted via the second signal wiring (34F, 34B) arrive at the logic IC substantially without delay. Malfunction of the logic IC can be suppressed. Even when a length of the first signal wiring (32F, 32B) and a length of the second signal wiring (34F, 34B) are 5 mm or more, a difference in the propagation speed between the two can be reduced. Even when the length of the first signal wiring (32F, 32B) and the length of the second signal wiring (34F, 34B) are 10 mm or more and 20 mm or less, malfunction of the logic IC can be suppressed. The first surfaces (122F, 122B) of the second resin insulating layers (120F, 120B) are similar to the first surfaces (22F, 22B) of the first resin insulating layers (20F, 20B). Therefore, the first signal wirings (132F, 132B) and the second signal wirings (134F, 134B) have similar effects as the first signal wirings (32F, 32B) and the second signal wirings (34F, 34B). A high quality wiring substrate 2 is provided.

First Alternative Example

In a first alternative example of the embodiment, the specific metal contained in the copper alloy forming the first layer is at least one of nickel, zinc, gallium, silicon, and magnesium.

Second Alternative Example

In a second alternative example of the embodiment, the copper alloy forming the first layer does not contain carbon.

Third Alternative Example

In a third alternative example of the embodiment, the copper alloy forming the first layer does not contain oxygen.

Modified Examples

Figure 5:
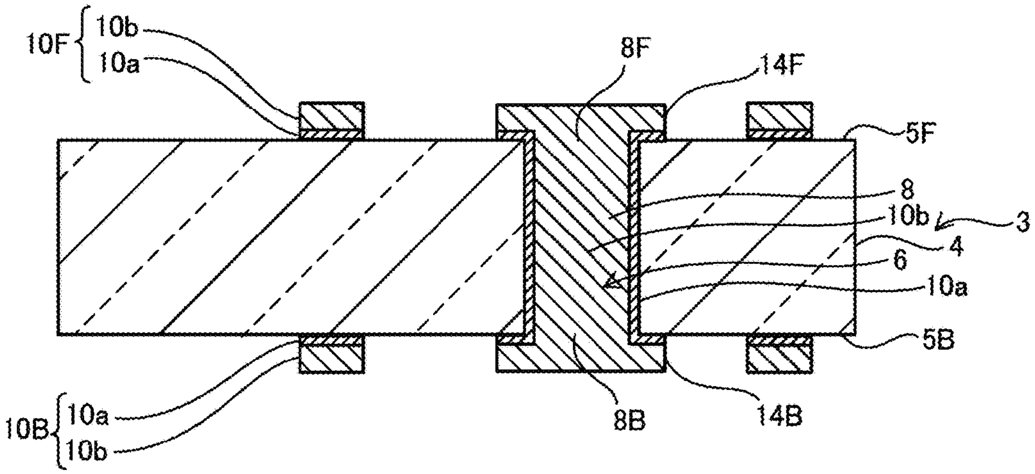
FIG. 5 is a cross-sectional view schematically illustrating a method for manufacturing a wiring substrate according to a modified example of the present invention.
Figure 6:
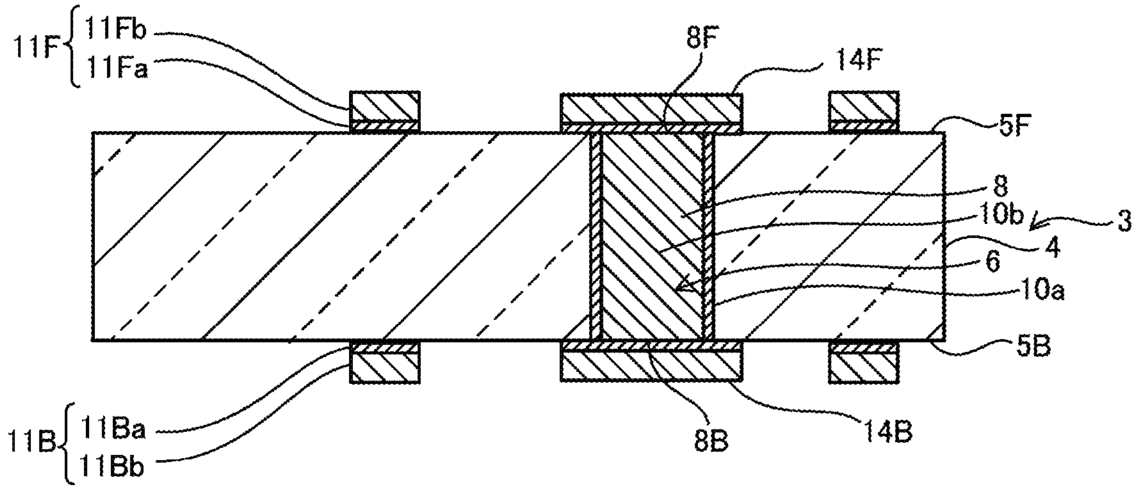
FIG. 6 is a cross-sectional view schematically illustrating a method for manufacturing a wiring substrate according to a modified example of the present invention.

Similar to the embodiment, wiring substrates of modified examples each include a core substrate 3, a front side build-up layer (300F), and a back side build-up layer (300B). The core substrate 3 of the embodiment is different from the core substrates 3 of the modified examples. The front side build-up layer (300F) of the embodiment is the same as the front side build-up layer (300F) of each of the modified examples. The back side build-up layer (300B) of the embodiment is the same as the back side build-up layer (300B) of each of the modified examples. Cross-sections of the core substrates 3 of the modified examples are respectively illustrated in FIGS. 5 and 6. As illustrated in FIGS. 5 and 6, the core substrates 3 of the modified examples respectively have conductor layers (10F, 11F) on the front surface (5F) of the glass substrate 4. The conductor layers (10F, 11F) each include lands (14F) covering the upper ends (8F) of the through-hole conductors 8. Further, the core substrates 3 of the modified examples respectively have conductor layers (10B, 11B) on the back surface (5B) of the substrate 4. The conductor layers (10B, 11B) each include lands (14B) covering the lower ends (8B) of the through-hole conductors 8. The lands (14F) and the lands (14B) are electrically connected by the through-hole conductors 8. The core substrate 3 of the embodiment has no conductor layer on the front surface (5F) and no conductor layer on the back surface (5B).

In the modified examples, the front side resin insulating layer (resin insulating layer directly above the core substrate) forming the front side build-up layer (300F) is formed on the conductor layer (10F, 11F) and the front surface (5F). The resin insulating layer (first resin insulating layer (20F)) directly above the core substrate has openings (first openings (26F)) for via conductors reaching the lands (14F). Via conductors (first via conductors (40F)) similar to those of the embodiment are formed in the openings for via conductors. Since the via conductors penetrating the resin insulating layer directly above the core substrate reach the lands (14F), the seed layer (first layer (31Fa)) forming the via conductors is in contact with upper surfaces of the lands (14F) and inner wall surfaces of the openings. The via conductors penetrating the resin insulating layer directly above the core substrate are electrically connected to the through-hole conductors 8 via the lands (14F).

In the modified examples, the back side resin insulating layer (resin insulating layer directly below the core substrate) forming the back side build-up layer (300B) is formed on the conductor layer (10B, 11B) and the back surface (5B). The resin insulating layer (first resin insulating layer (20B)) directly below the core substrate has openings (first openings) for via conductors reaching the lands (14B). Via conductors (first via conductors (40B)) similar to those of the embodiment are formed in the openings for via conductors. Since the via conductors penetrating the resin insulating layer directly below the core substrate reach the lands (14B), the seed layer forming the via conductors is in contact with upper surfaces of the lands (14B) and inner wall surfaces of the openings. The via conductors penetrating the resin insulating layer directly below the core substrate are electrically connected to the through-hole conductors 8 via the lands (14B).

Method for Manufacturing Wiring Substrates of Modified Examples

The core substrate 3 illustrated in FIG. 5 is a core substrate 3 of a first example. A method for manufacturing the core substrate 3 of the first example is described below. An intermediate substrate illustrated in FIG. 4D is prepared. The conductor layer (10F) is formed on the front surface (5F) using a subtractive method. The conductor layer (10B) is formed on the back surface (5B). The core substrate 3 of the first example of the modified examples is obtained.

The conductor layer (10F) is formed of the seed layer (10*a*) and the electrolytic plating layer (10*b*) on the seed layer (10*a*). The conductor layer (10B) is formed of the seed layer (10*a*) and the electrolytic plating layer (10*b*) on the seed layer (10*a*). The seed layer (10*a*) is formed by electroless plating. The seed layer (10*a*) forming the conductor layer (10F), the seed layer (10*a*) forming the conductor layer (10B), and the seed layer (10*a*) forming the through-hole conductors 8 are common. The electrolytic plating layer (10*b*) forming the conductor layer (10F), the electrolytic plating layer (10*b*) forming the conductor layer (10B), and the electrolytic plating layer (10*b*) forming the through-hole conductors 8 are common. The conductor layers (10F, 10B) and the through-hole conductors 8 are formed at the same time. The through-hole conductors 8 and the lands (14F, 14B) are formed at the same time. The through-hole conductors 8 and the lands (14F, 14B) are integrally formed. There is no seed layer between the upper ends (8F) and the lands (14F). There is no seed layer between the lower ends (8B) and the lands (14B).

The core substrate 3 illustrated in FIG. 6 is a core substrate 3 of a second example. A method for manufacturing the core substrate 3 of the second example is described below. An intermediate substrate illustrated in FIG. 4E is prepared. Seed layers (11Fa, 11Ba) are respectively formed on the front surface (5F) and the back surface (5B). The seed layers (11Fa, 11Ba) are formed by electroless plating. It is also possible that the seed layers (11Fa, 11Ba) are formed by sputtering. The seed layer (11Fa) covers the front surface (5F) of the substrate 4 and the upper ends (8F) of the through-hole conductors 8. The seed layer (11Ba) covers the back surface (5B) of the substrate 4 and the lower ends (8B) of the through-hole conductors 8. Electrolytic plating layers (11Fb, 11Bb) are respectively formed on the seed layers (11Fa, 11Ba). After that, the conductor layers (11F, 11B) are formed using a subtractive method. The core substrate 3 of the second example of the modified examples is obtained.

The conductor layer (11F) is formed of the seed layer (11Fa) and the electrolytic plating layer (11Fb) on the seed layer (11Fa). The conductor layer (11B) is formed of the seed layer (11Ba) and the electrolytic plating layer (11Bb) on the seed layer (11Ba). The seed layer (11Fa) is formed on the front surface (5F) of the substrate 4. The seed layer (11Fa) covers the upper ends (8F) of the through-hole conductors 8. The seed layer (11Ba) is formed on the back surface (5B) of the substrate 4. The seed layer (11Ba) covers the lower ends (8B) of the through-hole conductors 8. The seed layers (11Fa, 11Ba) are formed by electroless plating. It is also possible that the seed layers (11Fa, 11Ba) are formed by sputtering. The seed layers (11Fa, 11Ba) that respectively form the conductor layers (11F, 11B) and the seed layer (10*a*) that forms the through-hole conductors 8 are different from each other. The electrolytic plating layers (11Fb, 11Bb) that respectively form the conductor layers (11F, 11B) and the electrolytic plating layer (10*b*) that forms the through-hole conductors 8 are different from each other. The conductor layers (11F, 11B) and the through-hole conductors 8 are separately formed. In the second example, the seed layer (11Fa) forming the lands (14F) exists between the electrolytic plating layer (10*b*) forming the upper ends (8F) and the electrolytic plating layer (11Fb) forming the lands (14F). The seed layer (11Ba) forming the lands (14B) exists between the electrolytic plating layer (10*b*) forming the lower ends (8B) and the electrolytic plating layer (11Bb) forming the lands (14B). In contrast, in the first example (FIG. 5), the electrolytic plating layer (10*b*) forming the upper ends (8F) and the electrolytic plating layer (10*b*) forming the lands (14F) are continuous. The electrolytic plating layer (10*b*) forming the lower ends (8B) and the electrolytic plating layer (10*b*) forming the lands (14B) are continuous.

The front side build-up layer (300F) and back side build-up layer (300B) are formed on each of the core substrates 3 of the modified examples in the same way as the embodiment.

In the present specification, the term "flat surface" is used with respect to the shape of the inner wall surface, the shapes of the flat parts (91*a*), and the shapes of the first inorganic particles 91. The meaning of the "flat surface" used with respect to these is illustrated in FIGS. 1 and 2. That is, in FIGS. 1 and 2, the inner wall surface is drawn substantially straight. The shape of the inner wall surface in FIGS. 1 and 2 is substantially a straight line. The term "flat surface" in the present specification includes a substantially straight line illustrated in a cross section. As illustrated in the cross sections of the first inorganic particles 91 in FIGS. 1 and 2, in a cross section, cutting along a flat surface includes cutting along a straight line. The term "flat surface" in the present specification does not mean a perfect flat surface, but includes a substantially flat surface. A substantially flat surface may include small unevenness.

Japanese Patent Application Laid-Open Publication No. 2015-133473 describes a multilayer substrate having a core formed of a glass material. In Japanese Patent Application Laid-Open Publication No. 2015-133473, light transmittance of a first insulating layer formed of a glass material is controlled. As an example of a method for controlling the light transmittance, Japanese Patent Application Laid-Open Publication No. 2015-133473 describes that a coloring agent is contained in the first insulating layer. It is thought difficult for the first insulating layer formed of a glass material to uniformly contain a coloring agent.

A wiring substrate according to an embodiment of the present invention includes: a core substrate that has a substrate formed of glass, a through hole penetrating the substrate, and a through-hole conductor formed in the through hole; a first resin insulating layer that is formed on the core substrate, and has a first surface, a second surface on the opposite side with respect to the first surface, and an opening for a via conductor extending from the first surface to the second surface; a first conductor layer that is formed on the first surface of the first resin insulating layer; a via conductor that is formed in the opening and electrically connects the through-hole conductor and the first conductor layer; and a second resin insulating layer that is formed on the first surface of the first resin insulating layer and on the first conductor layer. The first conductor layer is formed of a seed layer and an electrolytic plating layer on the seed layer, the seed layer formed of a first layer formed on the first surface and a second layer on the first layer. In a cross section of a conductor circuit included in the first conductor layer, a width of the first layer is larger than a width of the second layer, and a width of the electrolytic plating layer is larger than the width of the first layer.

In a wiring substrate according to an embodiment of the present invention, the core substrate includes the glass substrate. The glass substrate is excellent in flatness. Therefore, the first surface of the first resin insulating layer is excellent in flatness. The first surface is excellent in smoothness. Fine signal wirings can be formed on the first surface of the first resin insulating layer. In the cross section of the conductor circuit, the width of the second layer is smaller than the width of the first layer and the width of the electrolytic plating layer. A side wall of the conductor circuit is not formed straight. The side wall has a recess. A stress caused by a difference in thermal expansion coefficient between the glass substrate and the resin insulating layers (the first resin insulating layer and the second resin insulating layer) is unlikely to be transmitted to the first resin insulating layer along the side wall of the conductor circuit. It is thought that the stress is dispersed by the recess portion. A crack along an extension of an interface between the side wall of the conductor circuit and the second resin insulating layer is unlikely to occur in the first resin insulating layer. The width of the first layer is larger than the width of the second layer. Since the side wall of the conductive circuit has the recess, a contact area between the side wall of the conductive circuit and the second resin insulating layer is large. The second resin insulating layer is unlikely to peel off from the side wall of the conductor circuit.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a core substrate comprising a through-hole conductor;

a first resin insulating layer formed on the core substrate;

a first conductor layer formed on the first resin insulating layer and comprising a seed layer and an electrolytic plating layer formed on the seed layer;

a via conductor formed in the first resin insulating layer such that the via conductor electrically connects the through-hole conductor and the first conductor layer; and a second resin insulating layer formed on the first resin insulating layer such that the second resin insulating layer is covering the first conductor layer, wherein the core substrate includes a glass substrate such that the through-hole conductor is penetrating through the glass substrate, the first conductor layer is formed such that the seed layer includes a first layer formed on a surface of the first resin insulating layer and a second layer formed on the first layer, the first conductor layer includes a conductor circuit and is formed such that a width of the first layer is larger than a width of the second layer in the conductor circuit, that a width of the electrolytic plating layer is larger than the width of the first layer in the conductor circuit and that the conductor circuit has a side wall having a recess, and the second resin insulating layer includes inorganic particles and resin such that the recess in the side wall of the conductor circuit is filled with the second resin insulating layer and that sizes of inorganic particles in the recess are smaller than sizes of other inorganic particles in the second resin insulating layer.

2. The wiring substrate according to claim 1, wherein the first conductor layer is formed such that a width of the conductor circuit has a minimum value at a boundary portion between the seed layer and the electrolytic plating layer.

3. The wiring substrate according to claim 2, wherein the first resin insulating layer includes inorganic particles and resin such that the inorganic particles include first inorganic particles and second inorganic particles such that the first inorganic particles are forming an inner wall surface in an opening in which the via conductor is formed, that the second inorganic particles are embedded in the first resin insulating layer, and that shapes of the first inorganic particles are different from shapes of the second inorganic particles.

4. The wiring substrate according to claim 2, wherein the second resin insulating layer is formed such that the sizes of the inorganic particles in the recess in the side wall of the conductor circuit are 1.0 μm or less.

5. The wiring substrate according to claim 2, wherein the first conductor layer is formed such that the first layer and the second layer are formed by sputtering.

6. The wiring substrate according to claim 2, wherein the first conductor layer is formed such that the first layer includes a copper alloy and that the second layer includes copper.

7. The wiring substrate according to claim 6, wherein the first conductor layer is formed such that a content of the copper in the copper alloy is 90.0 at % or more.

8. The wiring substrate according to claim 6, wherein the first conductor layer is formed such that the copper alloy includes copper, aluminum and at least one metal selected from the group consisting of nickel, zinc, gallium, silicon, and magnesium.

9. The wiring substrate according to claim 2, wherein the first conductor layer is formed such that a thickness of the seed layer is in a range of 0.02 μm to 1.0 μm.

10. The wiring substrate according to claim 1, wherein the first resin insulating layer includes inorganic particles and resin such that the inorganic particles include first inorganic particles and second inorganic particles such that the first inorganic particles are forming an inner wall surface in an opening in which the via conductor is formed, that the second inorganic particles are embedded in the first resin insulating layer, and that shapes of the first inorganic particles are different from shapes of the second inorganic particles.

11. The wiring substrate according to claim 10, wherein the first resin insulating layer is formed such that the first inorganic particles have flat parts having exposed surfaces and that the inner wall surface in the opening includes the exposed surfaces of the flat parts and a surface of the resin.

12. The wiring substrate according to claim 1, wherein the second resin insulating layer is formed such that the sizes of the inorganic particles in the recess in the side wall of the conductor circuit are 1.0 μm or less.

13. The wiring substrate according to claim 1, wherein the first conductor layer is formed such that the first layer and the second layer are formed by sputtering.

14. The wiring substrate according to claim 1, wherein the first conductor layer is formed such that the first layer includes a copper alloy and that the second layer includes copper.

15. The wiring substrate according to claim 14, wherein the first conductor layer is formed such that a content of the copper in the copper alloy is 90.0 at % or more.

16. The wiring substrate according to claim 14, wherein the first conductor layer is formed such that the copper alloy includes copper, aluminum and at least one metal selected from the group consisting of nickel, zinc, gallium, silicon, and magnesium.

17. The wiring substrate according to claim 1, wherein the first conductor layer is formed such that a thickness of the seed layer is in a range of 0.02 μm to 1.0 μm.

18. The wiring substrate according to claim 1, wherein the first conductor layer is formed such that a thickness of the first layer is in a range of 0.01 μm to 0.5 μm.

19. The wiring substrate according to claim 1, wherein the first conductor layer is formed such that a thickness of the second layer is in a range of 0.01 μm to 0.9 μm.

20. A method of forming a wiring substrate, comprising:

forming a core substrate comprising a through-hole conductor;

forming a first resin insulating layer on the core substrate;

forming a first conductor layer on the first resin insulating layer such that the first conductor layer includes a seed layer and an electrolytic plating layer on the seed layer;

forming a via conductor in the first resin insulating layer such that the via conductor electrically connects the through-hole conductor and the first conductor layer; and forming a second resin insulating layer on the first resin insulating layer such that the second resin insulating layer covers the first conductor layer, wherein the core substrate includes a glass substrate such that the through-hole conductor is penetrating through the glass substrate, the forming the first conductor layer includes forming the seed layer comprising a first layer formed on a surface of the first resin insulating layer and a second layer formed on the first layer, the forming the first conductor layer includes forming a conductor circuit such that a width of the first layer is larger than a width of the second layer in the conductor circuit, that a width of the electrolytic plating layer is larger than the width of the first layer in the conductor circuit and that the conductor circuit has a side wall having a recess, the first resin insulating layer includes inorganic particles and resin, the forming the via conductor includes forming an opening in the first resin insulating layer such that the inorganic particles have protruding portions in the opening and removing the protruding portions of the inorganic particles such that the inorganic particles have exposed surfaces forming an inner wall surface in the opening in which the via conductor is formed, and the second resin insulating layer includes inorganic particles and resin such that the recess in the side wall of the conductor circuit is filled with the second resin insulating layer and that sizes of inorganic particles in the recess are smaller than sizes of other inorganic particles in the second resin insulating layer.

* * * * *